(12) United States Patent
Qin et al.

(10) Patent No.: US 12,276,881 B2
(45) Date of Patent: Apr. 15, 2025

(54) LIGHT-EMITTING SUBSTRATE, LIGHT-EMITTING MODULE AND DISPLAY DEVICE

(71) Applicants: BOE MLED Technology Co., Ltd., Beijing (CN); BOE TECHNOLOGY GROUP CO., LTD., Beijing (CN)

(72) Inventors: Pei Qin, Beijing (CN); Yutao Hao, Beijing (CN); Hao Zhou, Beijing (CN); Donglei Li, Beijing (CN); Ying Chen, Beijing (CN); Honghao Yu, Beijing (CN); Jie Gao, Beijing (CN); Jiaxin Li, Beijing (CN); Jingran Niu, Beijing (CN); Jinpeng Li, Beijing (CN)

(73) Assignees: BOE MLED TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/249,553

(22) PCT Filed: Mar. 28, 2022

(86) PCT No.: PCT/CN2022/083513
§ 371 (c)(1),
(2) Date: Apr. 19, 2023

(87) PCT Pub. No.: WO2023/184122
PCT Pub. Date: Oct. 5, 2023

(65) Prior Publication Data
US 2024/0377677 A1 Nov. 14, 2024

(51) Int. Cl.
*G02F 1/13357* (2006.01)
*G02F 1/1335* (2006.01)
(Continued)

(52) U.S. Cl.
CPC .. *G02F 1/133603* (2013.01); *G02F 1/133605* (2013.01); *G02F 1/133607* (2021.01);
(Continued)

(58) Field of Classification Search
CPC ......... G02F 1/133603; G02F 1/133614; G02F 1/133607
See application file for complete search history.

(56) References Cited

U.S. PATENT DOCUMENTS

2004/0233665 A1* 11/2004 West ................. G02F 1/133603
362/555
2007/0189011 A1* 8/2007 Song ....................... F21V 29/71
362/294
(Continued)

FOREIGN PATENT DOCUMENTS

CN 202631771 U 12/2012
CN 103682062 A 3/2014
(Continued)

OTHER PUBLICATIONS

PCT International Search Report (w/ English translation) and Written Opinion for corresponding PCT Application No. PCT/CN2022/083513, mailed Oct. 10, 2022, 11 pages.

*Primary Examiner* — Lucy P Chien
(74) *Attorney, Agent, or Firm* — Dority & Manning, P.A.

(57) ABSTRACT

A light-emitting substrate includes a substrate and a plurality of light-emitting assemblies. The plurality of light-emitting assemblies are located on a side of the substrate. At least one light-emitting assembly includes a light-emitting element and a light adjustment portion arranged around the light-emitting element. The light adjustment portion includes a plurality of sub-structures spaced apart from each other. In any two sub-structures in the light adjustment portion in any direction away from the light-emitting element, a height of
(Continued)

a sub-structure closer to the light-emitting element is less than a height of a sub-structure farther from the light-emitting element.

20 Claims, 14 Drawing Sheets

(51) Int. Cl.
*H01L 25/16* (2023.01)
*H10H 20/856* (2025.01)

(52) U.S. Cl.
CPC .. *G02F 1/133611* (2013.01); *G02F 1/133612* (2021.01); *G02F 1/133614* (2021.01); *H01L 25/167* (2013.01); *H10H 20/856* (2025.01)

(56) References Cited

U.S. PATENT DOCUMENTS

| | | | |
|---|---|---|---|
| 2009/0140277 A1 | 6/2009 | Wang et al. | |
| 2011/0205448 A1 | 8/2011 | Takata | |
| 2011/0292679 A1 | 12/2011 | Kim | |
| 2015/0159834 A1 | 6/2015 | Chang | |
| 2016/0216559 A1 | 7/2016 | De Jesus Cazarez Lopez et al. | |
| 2018/0114780 A1 | 4/2018 | Sung et al. | |
| 2018/0335559 A1* | 11/2018 | Cho | G02B 6/0091 |
| 2019/0094623 A1 | 3/2019 | Chang et al. | |
| 2021/0018798 A1 | 1/2021 | Kobayashi | |
| 2021/0271136 A1 | 9/2021 | Kobayashi | |
| 2023/0094044 A1 | 3/2023 | He et al. | |

FOREIGN PATENT DOCUMENTS

| | | | |
|---|---|---|---|
| CN | 203731289 U | 7/2014 | |
| CN | 107092132 A | 8/2017 | |
| CN | 207021287 U | 2/2018 | |
| CN | 110609417 A | 12/2019 | |
| CN | 110637238 A | 12/2019 | |
| CN | 112882281 A | 6/2021 | |
| CN | 110637238 B | 12/2021 | |
| EP | 1768197 A2 * | 3/2007 | ............... F21K 9/60 |
| JP | 2015079575 A | 4/2015 | |
| KR | 20080060654 A | 7/2008 | |
| WO | WO-2019225911 A1 * | 11/2019 | ....... G02F 1/133516 |

* cited by examiner

LIGHT-EMITTING SUBSTRATE, LIGHT-EMITTING MODULE AND DISPLAY DEVICE

CROSS-REFERENCE TO RELATED APPLICATION

This application is a national phase entry under 35 USC 371 of International Patent Application No. PCT/CN 2022/083513 filed on Mar. 28, 2022, which is incorporated herein by reference in its entirety.

TECHNICAL FIELD

The present disclosure relates to the field of display technologies, and in particular, to a light-emitting substrate, a light-emitting module and a display device.

BACKGROUND

Light-emitting substrates, such as mini light-emitting diode (mini LED) light-emitting substrates, have characteristics of self-luminescence, fast response, high contrast, high color gamut, wide viewing angle, and capability of being manufactured on a flexible substrate, and are widely used.

SUMMARY

In an aspect, a light-emitting substrate is provided. The light-emitting substrate includes a substrate and a plurality of light-emitting assemblies. The plurality of light-emitting assemblies are located on a side of the substrate. At least one light-emitting assembly includes a light-emitting element and a light adjustment portion arranged around the light-emitting element. The light adjustment portion includes a plurality of sub-structures spaced apart from each other. In any two sub-structures in the light adjustment portion in any direction away from the light-emitting element, a height of a sub-structure closer to the light-emitting element is less than a height of a sub-structure farther from the light-emitting element.

In some embodiments, in any two sub-structures in the light adjustment portion in any direction away from the light-emitting element, an area of an orthographic projection, on the substrate, of a sub-structure closer to the light-emitting element is less than an area of an orthographic projection, on the substrate, of a sub-structure farther from the light-emitting element.

In some embodiments, the light-emitting substrate further includes a driving circuit layer and a reflective film. The driving circuit layer is located on the side of the substrate. The driving circuit layer includes a metal wiring and a conductive pad, and the conductive pad is electrically connected to the metal wiring. The reflective film is located on a side of the driving circuit layer away from the substrate, and exposes the conductive pad. The light-emitting element includes a light-emitting portion and a pin. The light-emitting portion is located on a side of the reflective film away from the driving circuit layer, and the pin is electrically connected to the conductive pad. The plurality of sub-structures in the light adjustment portion are located on a surface of the reflective film away from the driving circuit layer.

In some embodiments, the light-emitting substrate further includes a driving circuit layer and a reflective component. The driving circuit layer is located on the side of the substrate. The driving circuit layer includes a metal wiring and a conductive pad, and the conductive pad is electrically connected to the metal wiring. The reflective component is located on a side of the driving circuit layer away from the substrate. The reflective component encloses a reflective cavity, and has a communication hole. The light-emitting element includes a light-emitting portion and a pin. The light-emitting portion is located in the reflective cavity, and the pin is electrically connected to the conductive pad through the communication hole. The plurality of sub-structures in the light adjustment portion are located in the reflective cavity.

In some embodiments, the reflective component includes a bottom wall and side walls. The bottom wall has the communication hole. The plurality of sub-structures in the light adjustment portion are located on the bottom wall. The side walls each have an end connected to the bottom wall and another end extending from the bottom wall in a direction away from the substrate. The side walls and the bottom wall enclose the reflective cavity.

In some embodiments, a side wall is perpendicular to the bottom wall.

In some embodiments, an orthographic projection of an edge of a side wall away from the bottom wall on a reference plane parallel to the side wall is in a shape of a plurality of curves that are continuous or a plurality of broken lines that are continuous.

In some embodiments, in any direction away from the light-emitting element, at least two sub-structures in the light adjustment portion are located on a straight line.

In some embodiments, at least one sub-structure is in a shape of one of a cone, a pyramid, a truncated cone, a truncated pyramid and a hemisphere.

In some embodiments, the plurality of sub-structures in the light adjustment portion each have a height in a range of 250 μm to 1000 μm, inclusive.

In some embodiments, in any direction away from the light-emitting element, an absolute value of a height difference between any two adjacent sub-structures in the light adjustment portion is in a range of 200 μm to 300 μm, inclusive.

In some embodiments, in any direction away from the light-emitting element, an absolute value of a height difference between any two adjacent sub-structures in the light adjustment portion is equal to an absolute value of a height difference between any other two adjacent sub-structures in the light adjustment portion.

In some embodiments, the light-emitting substrate further includes diffusion particles. The diffusion particles are located in at least one sub-structure.

In some embodiments, the light-emitting substrate has a display region. The at least one light-emitting assembly includes at least two light-emitting assemblies. A brightness of a light-emitting element proximate to an edge of the display region is greater than a brightness of a light-emitting element located at another position of the display region.

In another aspect, a light-emitting module is provided. The light-emitting module includes the above light-emitting substrate and at least one lens. The at least one lens is located on a side of the plurality of light-emitting assemblies away from the substrate.

In some embodiments, a lens in the at least one lens has at least one first recess in a surface thereof proximate to the substrate. At least a portion of each of at least one sub-structure in the light adjustment portion is embedded in a first recess in the at least one first recess.

In some embodiments, the at least one first recess is a loop-shaped recess. An orthographic projection of the loop-shaped recess on the substrate surrounds an orthographic projection of the light-emitting element on the substrate.

In some embodiments, the at least one first recess includes a plurality of first recesses. Heights of sub-structures embedded in a same first recess are equal; and/or areas of orthographic projections, on the substrate, of the sub-structures embedded in the same first recess are equal.

In some embodiments, the at least one first recess includes a plurality of first recesses. In any two first recesses in any direction away from the light-emitting element, a depth of a first recess closer to the light-emitting element is less than a depth of a first recess farther from the light-emitting element; and/or in any two first recesses in any direction away from the light-emitting element, a width of a first recess closer to the light-emitting element is less than a width of a first recess farther from the light-emitting element.

In some embodiments, a lens in the at least one lens has a recessed portion in a surface thereof away from the substrate. An orthographic projection of the light-emitting element on the substrate is partially overlapped with an orthographic projection of the recessed portion on the substrate.

In some embodiments, a lens in the at least one lens has a second recess in a surface thereof proximate to the substrate. The light-emitting element includes a light-emitting portion, and at least a portion of the light-emitting portion is located in the second recess.

In some embodiments, the light-emitting element is configured to emit white light.

In some embodiments, the light-emitting element is configured to emit monochromatic light. The light-emitting module further includes a color conversion film. The color conversion film is located on a side of the at least one lens away from the light-emitting element.

In some embodiments, the color conversion film is a quantum dot film. A light-emitting element in a light-emitting assembly is a first light-emitting element, and an orthographic projection of the first light-emitting element on the substrate is proximate to an edge of an orthographic projection of the quantum dot film on the substrate. A light adjustment portion in a light-emitting assembly is a first light adjustment portion, and the first light adjustment portion surrounds the first light-emitting element. The light-emitting module further includes phosphor particles located in at least one sub-structure in the first light adjustment portion. The phosphor particles are configured to modulate light that is irradiated to the phosphor particles, so that the modulated light and unmodulated light emitted from the first light-emitting element are mixed into white light.

In some embodiments, the first light-emitting element is configured to emit blue light, and the phosphor particles include yellow phosphor particles; or the first light-emitting element is configured to emit blue light, and the phosphor particles include red phosphor particles and green phosphor particles.

In some embodiments, the light-emitting module further includes a brightness enhancement film. The brightness enhancement film is located on a side of the color conversion film away from the at least one lens.

In yet another aspect, a display device is provided. The display device includes a backlight module and a liquid crystal display panel. The liquid crystal display panel is located on a light exit side of the backlight module. The backlight module includes the above light-emitting substrate; or the backlight module includes the above light-emitting module.

In yet another aspect, a display device is provided. The display device includes a display panel. The display panel includes the above light-emitting substrate; or the display panel includes the above light-emitting module.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1A:
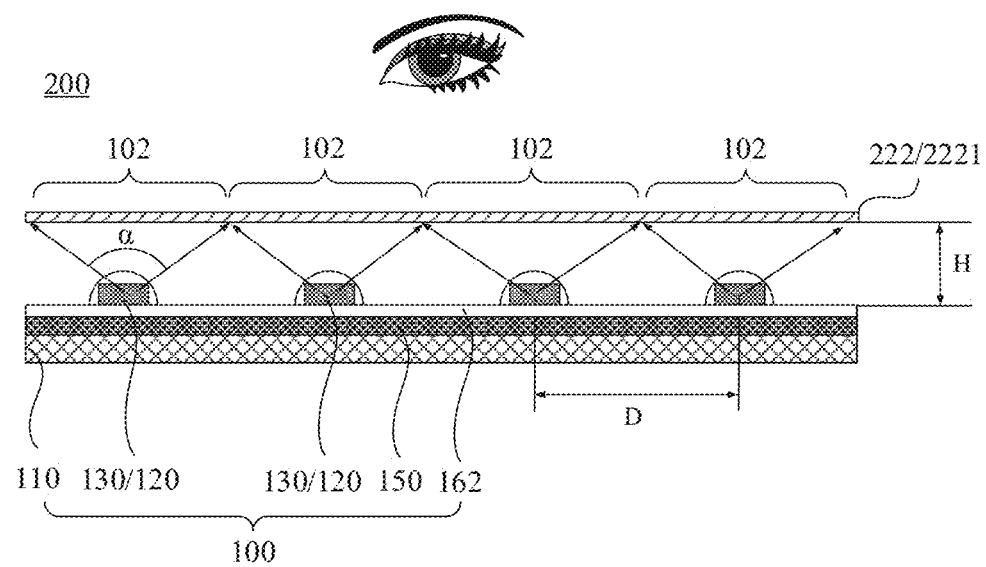
FIG. 1A is a structural diagram of a light-emitting module, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Figure 1B:
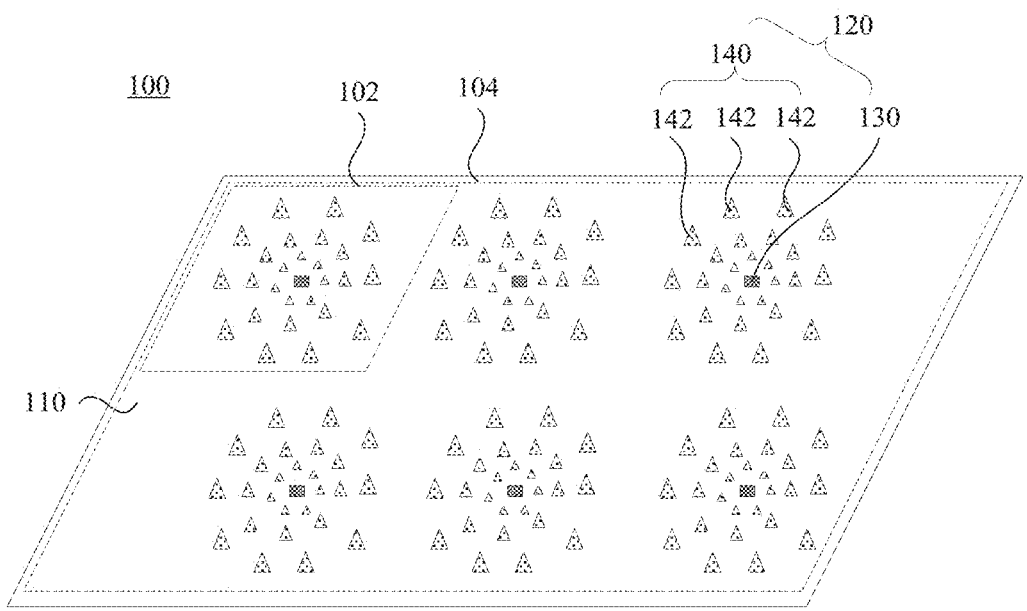
FIG. 1B is a structural diagram of a light-emitting substrate, in accordance with some embodiments.
Figure 1C:
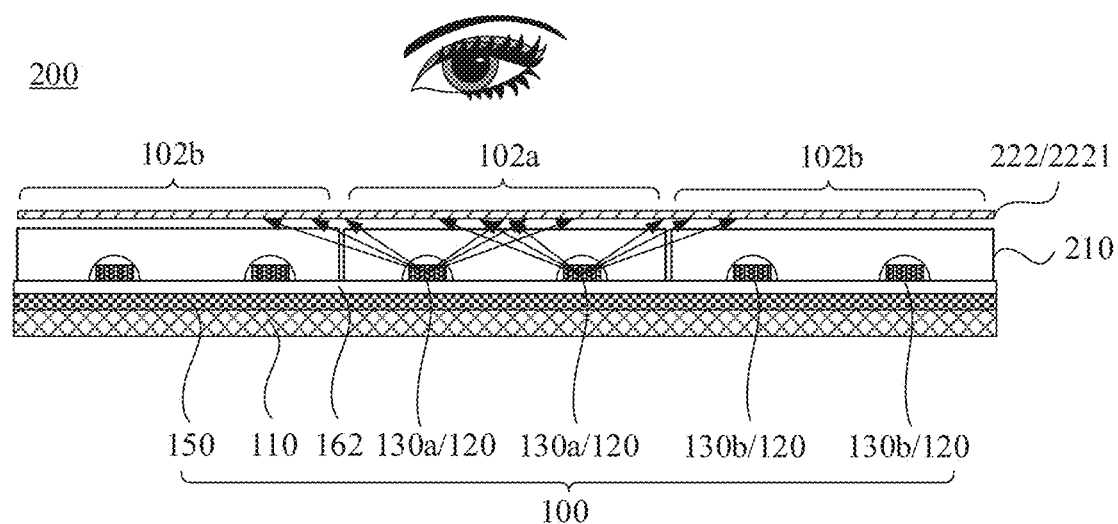
FIG. 1C is a structural diagram of a light-emitting module, in accordance with some other embodiments.

FIG. 1A is a structural diagram of a light-emitting module, in accordance with some embodiments. FIG. 1B is a structural diagram of a light-emitting substrate, in accordance with some embodiments. FIG. 1C is a structural diagram of a light-emitting module, in accordance with some other embodiments.

As shown in FIG. 1A, embodiments of the present disclosure provide a light-emitting module 200. It will be understood that the light-emitting module 200 is used for realizing functions such as backlight or image display. The light-emitting module 200 includes a light-emitting substrate 100. The light-emitting substrate 100 will be exemplarily described below.

In some examples, as shown in FIG. 1B, the light-emitting substrate 100 includes a substrate 110 and a plurality of light-emitting assemblies 120.

In some examples, the substrate 110 is a rigid substrate. In some other examples, the substrate 110 is a flexible substrate. For example, a material of the substrate 110 includes any one of plastic, FR-4 grade material, resin, glass, quartz, polyimide or polymethyl methacrylate (PMMA).

The plurality of light-emitting assemblies 120 are located on a side of the substrate 110. It will be understood that the light-emitting assembly 120 is used for emitting light. In some examples, the plurality of light-emitting assemblies 120 are located on a surface of the substrate 110. In some other examples, other film layer structure(s) are provided between the plurality of light-emitting assemblies 120 and the substrate 110.

In some examples, as shown in FIG. 1B, the substrate 110 is divided into a plurality of light-emitting regions 102, and a light-emitting assembly 120 is located in a light-emitting region 102. The plurality of light-emitting regions 102 are arranged in an array to constitute a display region 104. It will be understood that the display region 104 is capable of realizing the functions such as backlight or image display.

In some examples, the number of the light-emitting regions 102 may be 512, 1,000, or 2,000. The number of the light-emitting regions 102 is not further limited in the embodiments of the present disclosure.

In some implementations, as shown in FIG. 1A, each light-emitting assembly 120 includes light-emitting element(s) 130. The plurality of light-emitting assemblies 120 are arranged in an array, and light-emitting elements 130 in different light-emitting assemblies 120 are spaced apart. For example, a distance D between any two adjacent light-emitting elements 130 may be the same or different.

It will be understood that the light-emitting substrate 100 has a light exit side, and light emitted from the light-emitting element 130 is able to exit from the light exit side of the light-emitting substrate 100.

In some examples, as shown in FIG. 1A, a user views the light-emitting substrate 100 in a direction perpendicular to or approximately perpendicular to the substrate 110. That is, the user views the light-emitting substrate 100 in a direction perpendicular to or approximately perpendicular to a plane where the light-emitting element 130 is located. For example, the light-emitting substrate 100 in the above manner may be referred to as a direct-type light-emitting substrate.

It will be understood that a plurality of light-emitting elements 130 are capable of emitting light independently. That is, in some examples, the plurality of light-emitting elements 130 are capable of emitting light synchronously. In some other examples, a part of the plurality of light-emitting elements 130 may emit light, and another part of the light-emitting elements 130 may not emit light. In a case where the plurality of light-emitting elements 130 emit light synchronously, a brightness of each light-emitting element 130 may be the same or different.

In some examples, the plurality of light-emitting elements 130 are used for emitting blue light. In some other examples, the plurality of light-emitting elements 130 are used for emitting white light. In yet other examples, a part of the plurality of light-emitting elements 130 are used for emitting red light, another part of the light-emitting elements 130 are used for emitting green light, and yet another part of the light-emitting elements 130 are used for emitting blue light.

In some examples, the light-emitting element 130 is a light-emitting diode (LED). For example, the light-emitting element 130 may be any one of a traditional LED, a mini light-emitting diode (Mini LED), or a micro light-emitting diode (Micro LED).

For example, the traditional LED is an LED with a size of greater than or equal to 500 μm, and a distance between LEDs is greater than 2 mm. The Mini LED is an LED with a size of greater than or equal to 80 μm and less than 500 μm. The Micro LED is an LED with a size of less than 50 μm.

It will be noted that the size of the light-emitting element 130 and the distance D between any two adjacent light-emitting elements 130 in the plurality of light-emitting elements 130 are not further limited in the embodiments of the present disclosure.

It will be understood that, the plurality of light-emitting elements 130 are arranged in an array, so that the light-emitting substrate 100 is capable of realizing a small-range local dimming, thereby improving backlight and display performances of the light-emitting substrate 100.

In some examples, as shown in FIG. 1A, the light-emitting module 200 further includes a color conversion film 222. The color conversion film 222 is located on a side of the light-emitting elements 130 away from the substrate 110, and is used for performing color conversion on light emitted from the light-emitting elements 130 to obtain red light, green light and blue light. It will be understood that the light-emitting substrate 100 may display color image information by mixing the red light, green light and blue light with different intensities.

In some examples, the plurality of light-emitting elements 130 are used for emitting blue light, and the color conversion film 222 is a quantum dot (QD) film 2221 or a phosphor organic film.

For example, the quantum dot film 2221 includes red quantum dots and green quantum dots. As shown by the arrow directions in FIG. 1A, when the blue light emitted from the light-emitting elements 130 reaches the quantum dot film 2221, the red quantum dots are able to convert the blue light into red light, and the green quantum dots are able to convert the blue light into green light, thereby realizing the color conversion on the light emitted from the light-emitting elements 130. Similarly, the phosphor organic film includes phosphor particles capable of converting the blue light into yellow light, thereby realizing the color conversion on the light emitted from the light-emitting elements 130.

In some other examples, the plurality of light-emitting elements 130 are used for emitting white light, and the color conversion film 222 is a color filter. The color filter includes red filters, green filters and blue filters. As shown by the arrow directions in FIG. 1A, when the white light emitted from the light-emitting elements 130 reaches the color filter, red light, green light and blue light are able to exit from the color filter, and light of other colors is filtered by the color filter and cannot exit therefrom, thereby realizing the color conversion on the light emitted from the light-emitting elements 130.

In some examples, as shown in FIG. 1A, the light-emitting substrate 100 further includes a reflective film 162 located on a side of the substrate 110 proximate to the light-emitting elements 130. It will be understood that the reflective film 162 is used for reflecting light, so as to increase an intensity of light irradiated to the outside of the light-emitting substrate 100, thereby increasing a brightness of the light-emitting substrate 100 and reducing a power consumption of the light-emitting substrate 100.

For example, as shown in FIG. 1A, a distance between the reflective film 162 and a film (e.g., the color conversion film 222) may be referred to as a light mixing distance (also called optical distance, OD) H. That is, light emitted from two adjacent light-emitting elements 130 can be mixed between the reflective film 162 and this film (e.g., the color conversion film 222).

For example, the light mixing distance H is in a range of 1 mm to 5 mm, inclusive. For example, the light mixing distance H may be 1 mm, 2 mm, 2.2 mm, 2.5 mm, 2.8 mm, 3 mm, or 5 mm.

It will be understood that in order to reserve a space for thermal expansion and contraction of a film, a gap is usually left between two adjacent light-emitting regions 102. As shown by the arrow directions in FIG. 1C, when the light-emitting substrate 100 is subjected to a local dimming, i.e., when a part of the plurality of light-emitting elements 130 (e.g., light-emitting elements 130a) are controlled to emit light, and another part of the light-emitting elements 130 (e.g., light-emitting elements 130b) are controlled to not emit light, the light emitted from the light-emitting elements 130a is able to reach the light-emitting region 102a, and is further able to reach the light-emitting region 102b through the gap between two adjacent light-emitting regions 102, so that the light-emitting region 102b generates halos. That is, a light leakage phenomenon occurs in the light-emitting substrate 100, which affects the light-emitting performance of the light-emitting substrate 100.

It will be understood that in the embodiments of the present disclosure, the light-emitting region 102a and the light-emitting region 102b are only used for distinguishing two different light-emitting regions 102, and the light-emitting regions 102 are not further limited; the light-emitting element 130a and the light-emitting element 130b are only used for distinguishing two light-emitting elements 130 respectively located in the light-emitting region 102a and the light-emitting region 102b, and the light-emitting elements 130 are not further limited.

In some embodiments, the light leakage of the light-emitting substrate 100 may be reduced by increasing the number of the light-emitting regions 102 and arranging the light-emitting element 130 in a reflective bowl.

However, it is discovered through research that if the number of the light-emitting regions 102 is increased, a wiring difficulty of circuit structures (e.g., driving circuits respectively electrically connected to the light-emitting elements 130) is increased, thereby increasing the cost of the light-emitting substrate 100. The arrangement of the reflective bowl is complicated, which also increases the cost of the light-emitting substrate 100.

In order to reduce the light leakage of the light-emitting substrate 100, as shown in FIG. 1B, the light-emitting substrate 100 provided in some embodiments of the present disclosure includes the substrate 110 and the plurality of light-emitting assemblies 120. The plurality of light-emitting assemblies 120 are located on the side of the substrate 110. Each of at least one light-emitting assembly 120 includes light-emitting element(s) 130 and a light adjustment portion 140 arranged around the light-emitting element(s) 130. The light adjustment portion 140 includes a plurality of sub-structures 142 spaced apart from each other.

In some examples, as shown in FIG. 1B, each light-emitting assembly 120 includes the light-emitting element(s) 130 and the light adjustment portion 140 arranged around the light-emitting element(s) 130.

It will be understood that the substrate 110, the positional relationship between the light-emitting elements 130 and the substrate 110, and the type of the light-emitting element 130 are exemplarily described in the above embodiments of the present disclosure, and will not be repeated here. The light adjustment portion 140 will be exemplarily described below.

As shown in FIG. 1B, the light adjustment portion 140 surrounds the light-emitting element(s) 130. The light adjustment portion 140 includes the plurality of sub-structures 142 spaced apart. That is, the plurality of sub-structures 142 in the light adjustment portion 140 surround the light-emitting element(s) 130. In some examples, a distance between any two adjacent sub-structures 142 in the plurality of sub-structures 142 in the light adjustment portion 140 may be the same or different.

In some examples, the plurality of sub-structures 142 in the light adjustment portion 140 may surround the light-emitting element(s) 130 in a form of a circular ring, an elliptical loop, a rectangular loop, a polygonal loop, or other irregular loop.

In some other examples, the plurality of sub-structures 142 in the light adjustment portion 140 may surround the light-emitting element(s) 130 in a form of at least two concentric circular rings, at least two concentric elliptical loops, at least two concentric rectangular loops, at least two concentric polygonal loops, or at least two concentric irregular loops.

Figure 2A:
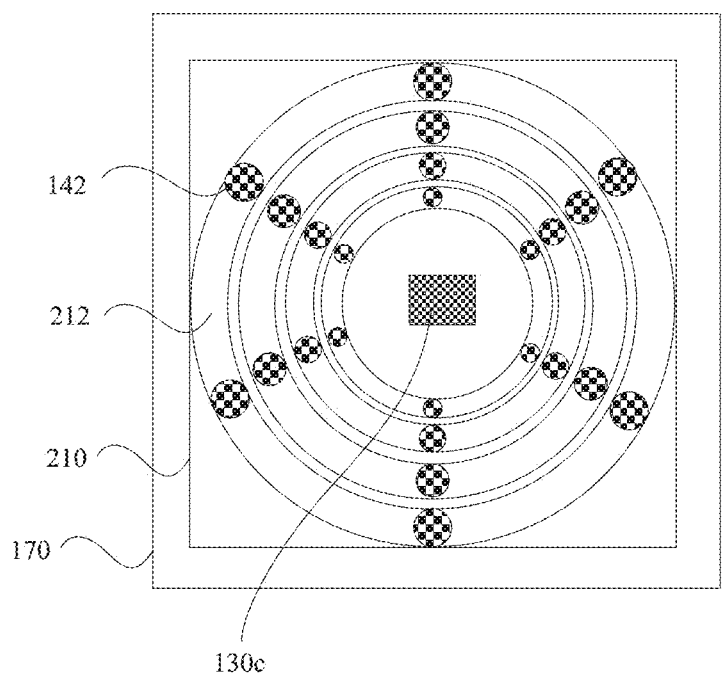
FIG. 2A is a structural diagram of sub-structures and a light-emitting element, in accordance with some embodiments.
Figure 2B:
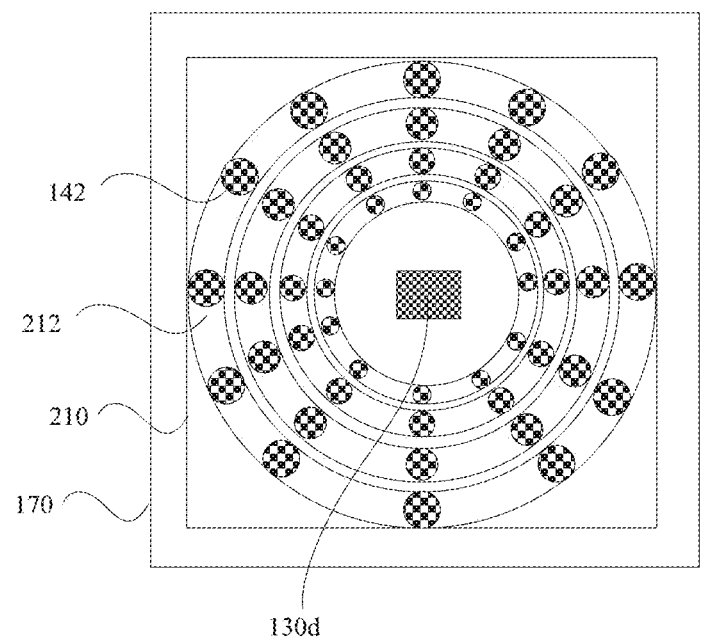
FIG. 2B is a structural diagram of sub-structures and a light-emitting element, in accordance with some other embodiments.

FIG. 2A is a structural diagram of sub-structures and a light-emitting element, in accordance with some embodiments. FIG. 2B is a structural diagram of sub-structures and a light-emitting element, in accordance with some other embodiments.

In some examples, as shown in FIGS. 2A and 2B, the plurality of sub-structures 142 in the light adjustment portion 140 surround a single light-emitting element 130. For example, the plurality of sub-structures 142 in the light adjustment portion 140 are spaced apart from each other, and are arranged in a shape of a circular ring or a plurality of concentric circular rings, so as to surround the light-emitting element 130.

For example, in a case where the plurality of sub-structures 142 in the light adjustment portion 140 surround a single light-emitting element 130, the number of the sub-structures 142 surrounding a light-emitting element 130 (e.g., light-emitting element 130c in FIG. 2A) and the number of the sub-structures 142 surrounding a different light-emitting element 130 (e.g., light-emitting element 130d in FIG. 2B) may be the same or different.

It will be understood that the light-emitting element 130c and the light-emitting element 130d are only used for distinguishing two different light-emitting elements 130, and the light-emitting elements 130 are not further limited.

In some examples, as shown in FIG. 2A, in the case where the plurality of sub-structures 142 in the light adjustment portion 140 surround a single light-emitting element 130, the light-emitting element 130 is located at a center of the circular ring or the concentric circular rings, so as to improve a structural regularity of the light-emitting assembly 120.

Figure 2C:
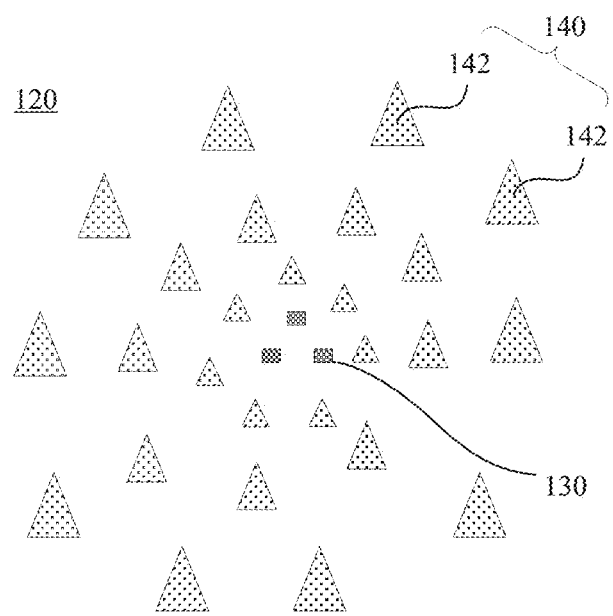
FIG. 2C is a structural diagram of a light-emitting assembly, in accordance with some embodiments.
Figure 2D:
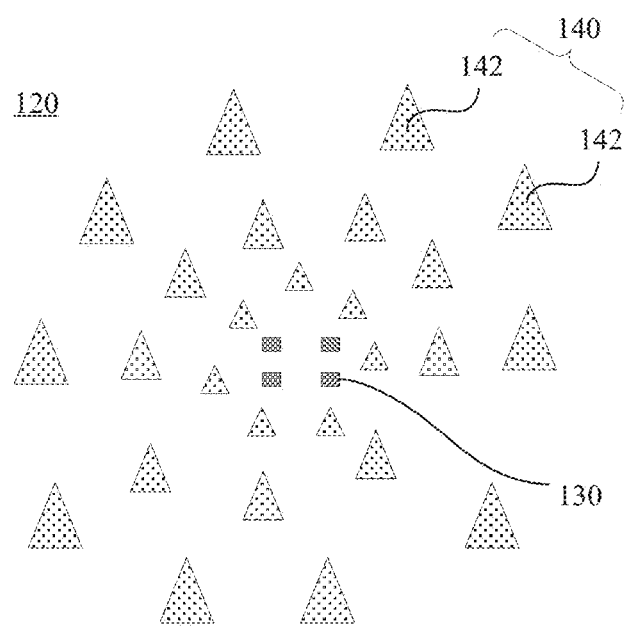
FIG. 2D is a structural diagram of a light-emitting assembly, in accordance with some other embodiments.

FIG. 2C is a structural diagram of a light-emitting assembly, in accordance with some embodiments. FIG. 2D is a structural diagram of a light-emitting assembly, in accordance with some other embodiments.

In some examples, as shown in FIGS. 2C and 2D, the plurality of sub-structures 142 in the light adjustment portion 140 surround light-emitting elements 130.

For example, as shown in FIG. 2C, in a case where the plurality of sub-structures 142 in the light adjustment portion 140 surround light-emitting elements 130, the light-emitting elements 130 may be sequentially connected in a clockwise or counterclockwise direction to constitute a triangle. As shown in FIG. 2D, in the case where the plurality of sub-structures 142 in the light adjustment portion 140 surround light-emitting elements 130, the light-emitting elements 130 may be sequentially connected in the clockwise or counterclockwise direction to constitute a rectangle, a square, a rhombus, or other irregular shape.

Figure 2E:
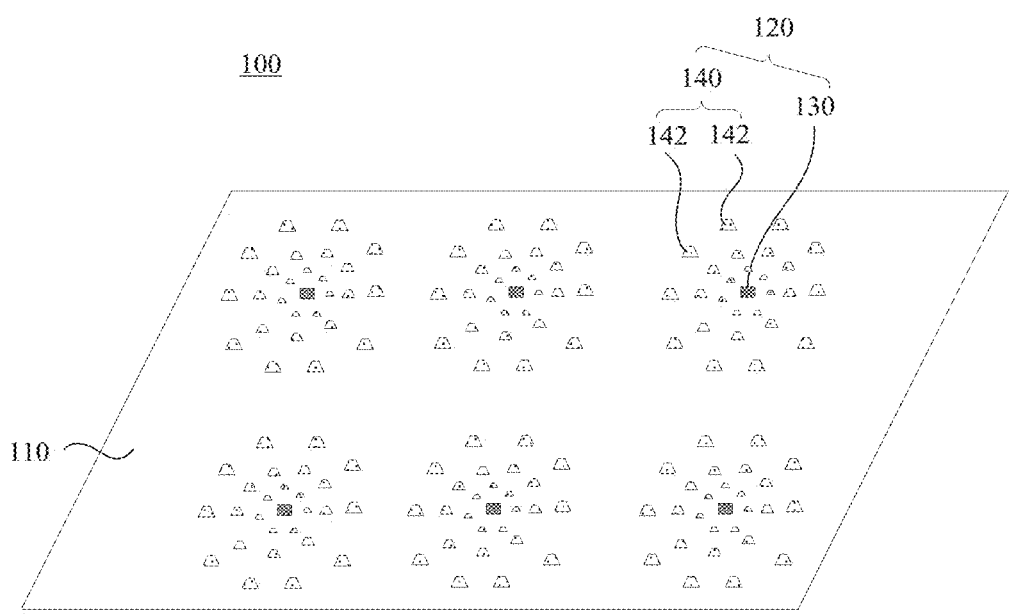
FIG. 2E is a structural diagram of a light-emitting substrate, in accordance with some other embodiments.
Figure 2F:
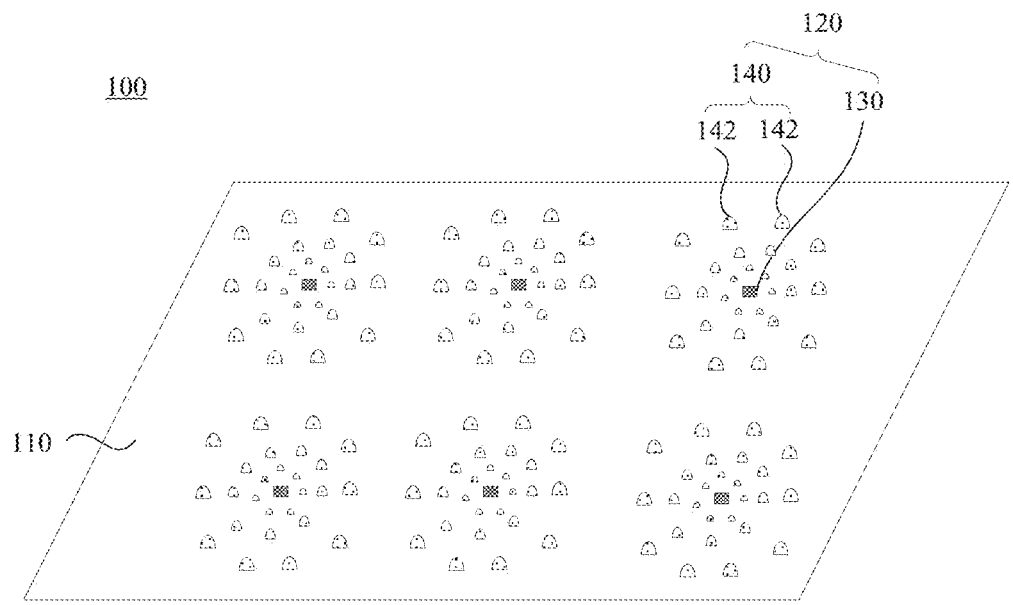
FIG. 2F is a structural diagram of a light-emitting substrate, in accordance with yet other embodiments.

FIG. 2E is a structural diagram of a light-emitting substrate, in accordance with some other embodiments. FIG. 2F is a structural diagram of a light-emitting substrate, in accordance with yet other embodiments.

In some examples, as shown in FIG. 1B, the sub-structure 142 is in a shape of a cone or a pyramid. In some other examples, as shown in FIG. 2E, the sub-structure 142 is in a shape of a truncated cone or a truncated pyramid. In yet other examples, as shown in FIG. 2F, the sub-structure 142 is in a shape of a hemisphere or a semiellipsoid.

It will be understood that the shapes of the plurality of sub-structures 142 in the light adjustment portion 140 may be the same or different. The shape of the sub-structure 142 is not further limited in the embodiments of the present disclosure.

Figure 2G:
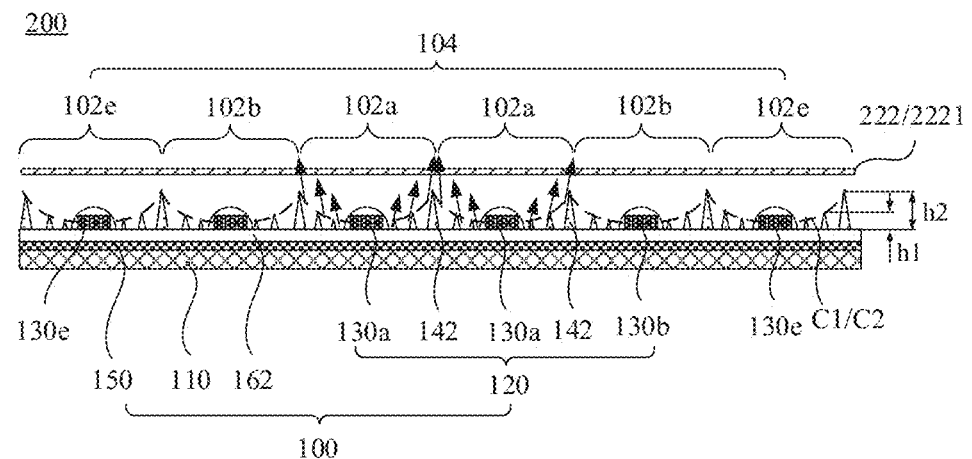
FIG. 2G is a structural diagram of a light-emitting module, in accordance with yet other embodiments.

FIG. 2G is a structural diagram of a light-emitting module, in accordance with yet other embodiments.

In some embodiments, as shown in FIG. 2G, in any two sub-structures 142 in the light adjustment portion 140 in any direction away from the light-emitting element 130, a height h1 of a sub-structure 142 closer to the light-emitting element 130 is less than a height h2 of a sub-structure 142 farther from the light-emitting element 130.

It will be understood that as shown in FIG. 2G, in any two sub-structures 142 in the light adjustment portion 140 in any direction away from the light-emitting element 130, a height of a sub-structure 142 closer to the light-emitting element 130 is less than a height of a sub-structure 142 farther from the light-emitting element 130. That is, in any direction away from the light-emitting element 130, heights of sub-structures 142 may be gradually increased.

For example, as shown in FIG. 2G, with a geometric center of the light-emitting element 130 as a starting point, vertexes or top surfaces of sub-structures 142 sequentially arranged in any direction away from the light-emitting element 130, which are away from the substrate 110, are sequentially connected, so that a concave curve C1 or a concave curved surface C2 may be obtained.

It will be understood that the light-emitting element 130 is located at a position of each concave curve or concave curved surface closest to the substrate 110, and a sub-structure 142 with a largest height in the light adjustment portion 140 is located at a position of the concave curve or the concave curved surface farthest from the substrate 110, and is farthest from the light-emitting element 130. That is, the concave curve or the concave curved surface is bent towards the substrate 110 (as shown by the dotted line in FIG. 2G).

In this way, the plurality of sub-structures 142 in the light adjustment portion 140 are able to collimate light, so as to reduce the diffusion of the light in all directions, thereby reducing an intensity of light irradiated to other light-emitting region 102.

In this way, when the light-emitting substrate 100 is subjected to the local dimming, as shown in FIG. 2G, if the light-emitting element 130a emits light, and the light-emitting element 130b does not emit light, the light adjustment portion 140 is able to collimate light emitted from the light-emitting element 130a, so as to reduce an intensity of light irradiated to the light-emitting region 102b. Thus, crosstalk generated between the two light-emitting elements 130 (i.e., the light-emitting element 130a and the light-emitting element 130b) is reduced, so that the light leakage phenomenon of the light-emitting substrate 100 is weakened, thereby improving the light-emitting performance of the light-emitting substrate 100.

In some examples, in any direction away from the light-emitting element 130, the heights of the sub-structures 142 are gradually increased in an arithmetic progression.

The light adjustment portion 140 is arranged to reduce the light leakage of the light-emitting substrate 100, so that the number of the light-emitting regions 102 does not need to be increased, so as to avoid increasing the wiring difficulty of the circuit structures. Moreover, for both a light-emitting substrate 100 with a large number of light-emitting regions 102 and a light-emitting substrate 100 with a small number of light-emitting regions 102, the light adjustment portion 140 may be arranged to reduce bright and dark regions and the light leakage, which improves the applicability of the light adjustment portion 140.

In addition, the light adjustment portion 140 is arranged to reduce the light leakage of the light-emitting substrate 100, there is no need to manufacture the reflective bowl and other structures, so that the cost of the light-emitting substrate 100 is reduced, and the process is simple, thereby improving the production efficiency of the light-emitting substrate 100.

It can be seen from the above that in the embodiments of the present disclosure, in any direction away from the light-emitting element 130, the heights of the sub-structures 142 in the light adjustment portion 140 are gradually increased. Thus, with the geometric center of the light-emitting element 130 as the starting point, the vertexes or the top surfaces of the sub-structures 142 sequentially arranged in any direction away from the light-emitting element 130, which are away from the substrate 110, are sequentially connected, so that the concave curve or the concave curved surface may be obtained.

In this way, the plurality of sub-structures 142 in the light adjustment portion 140 are able to collimate the light emitted from the light-emitting element 130, so as to reduce diffusion angles of the light in all directions, thereby reducing the intensity of the light irradiated to other light-emitting region 102.

In this way, when the light-emitting substrate 100 is subjected to the local dimming, the light adjustment portion 140 is able to collimate the light emitted from the light-emitting element 130, so as to reduce the intensity of the light irradiated to other light-emitting region 102. Thus, the crosstalk generated between the two light-emitting elements 130 is reduced, so that the light leakage phenomenon of the light-emitting substrate 100 is weakened, thereby improving the light-emitting performance of the light-emitting substrate 100.

The light adjustment portion 140 is arranged to reduce the light leakage of the light-emitting substrate 100, so that the number of the light-emitting regions 102 does not need to be increased, so as to avoid increasing the wiring difficulty of the circuit structures. Moreover, for both the light-emitting substrate 100 with the large number of light-emitting regions 102 and the light-emitting substrate 100 with the small number of light-emitting regions 102, the light adjustment portion 140 may be arranged to reduce the bright and dark regions and the light leakage, which improves the applicability of the light adjustment portion 140.

Figure 3A:
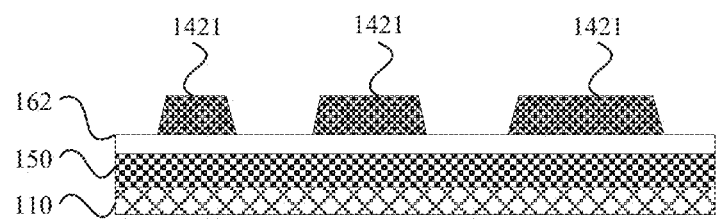
FIG. 3A is a first structural diagram corresponding to a step of forming sub-structures, in accordance with some embodiments.
Figure 3B:
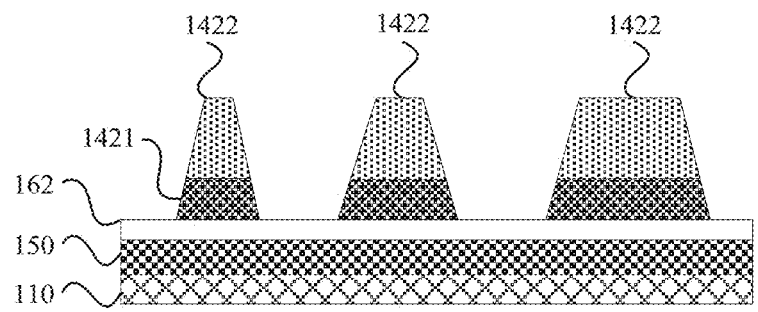
FIG. 3B is a second structural diagram corresponding to a step of forming sub-structures, in accordance with some embodiments.
Figure 3C:
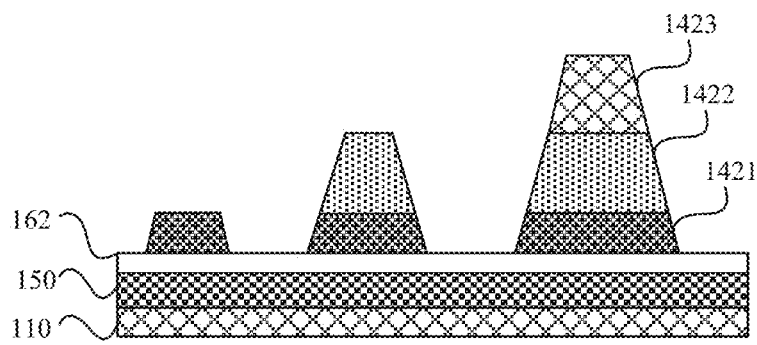
FIG. 3C is a third structural diagram corresponding to a step of forming sub-structures, in accordance with some embodiments.
Figure 3D:
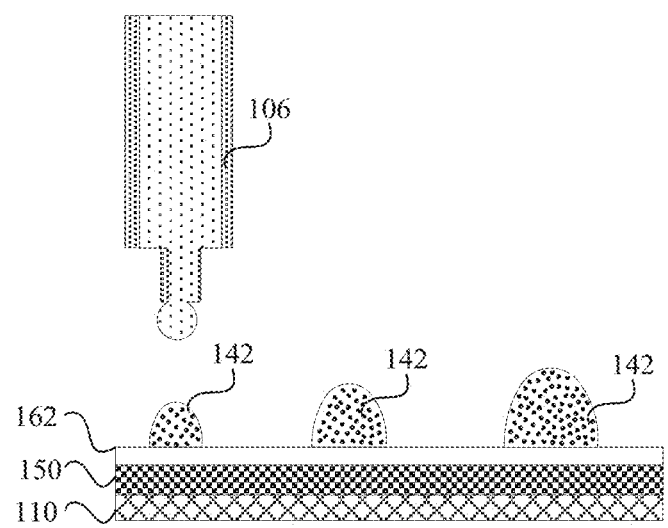
FIG. 3D is a structural diagram of sub-structures, in accordance with some embodiments.

FIG. 3A is a first structural diagram corresponding to a step of forming sub-structures, in accordance with some embodiments. FIG. 3B is a second structural diagram corresponding to a step of forming sub-structures, in accordance with some embodiments. FIG. 3C is a third structural diagram corresponding to a step of forming sub-structures, in accordance with some embodiments. FIG. 3D is a structural diagram of sub-structures, in accordance with some embodiments.

It can be seen from the above that the light adjustment portion 140 includes the plurality of sub-structures 142. A manufacturing method of the sub-structures 142 will be exemplarily described below with reference to FIGS. 3A to 3D.

In some examples, as shown in FIG. 3A, patterns 1421 in a first layer may be formed on the side of the substrate 110. It will be understood that the patterns 1421 in the first layer surround the light-emitting element(s) 130.

As shown in FIG. 3B, patterns 1422 in a second layer are respectively formed on surfaces of some of the patterns 1421 in the first layer away from the substrate 110. For example, an orthographic projection of the pattern 1422 in the second layer on the substrate 110 is within an orthographic projection of the pattern 1421 in the first layer on the substrate 110, so that the pattern 1421 in the first layer is able to support the pattern 1422 in the second layer.

As shown in FIG. 3C, patterns 1423 in a third layer are respectively formed on surfaces of some of the patterns 1422 in the second layer away from the patterns 1421 in the first layer.

For example, an orthographic projection of the pattern 1423 in the third layer on the substrate 110 is within the orthographic projection of the pattern 1422 in the second layer on the substrate 110, so that the pattern 1422 in the second layer is able to support the pattern 1423 in the third layer.

In some examples, a part of the plurality of sub-structures 142 (two or more sub-structures 142) each include a pattern 1421 in the first layer, another part of the sub-structures 142 (two or more sub-structures 142) each include a pattern 1421 in the first layer and a pattern 1422 in the second layer, and yet another part of the sub-structures 142 (two or more sub-structures 142) each include a pattern 1421 in the first layer, a pattern 1422 in the second layer and a pattern 1423 in the third layer.

It will be noted that in the embodiments of the present disclosure, the pattern 1421 in the first layer, the pattern 1422 in the second layer and the pattern 1423 in the third layer are only used for distinguishing the sub-structures 142 or some of the sub-structure 142 formed in different steps, and the shapes of the sub-structures 142 are not further limited.

It will be understood that the sub-structures 142 are formed layer by layer in a step-wise manner, so that in any direction away from the light-emitting element 130, the heights of the sub-structures 142 are able to be gradually increased.

It will be understood that in a case where the sub-structures 142 are formed layer by layer in the step-wise manner, the sub-structures 142 may be formed in two layers, three layers or four layers. The number of layers of forming the sub-structures 142 is not further limited in the embodiments of the present disclosure.

In some examples, the patterns 1421 in the first layer, the patterns 1422 in the second layer and the patterns 1423 in the third layer may be formed by a three-dimensional (3D) printing process or a 3D spraying process.

In some other examples, the patterned sub-structures 142 may be formed one by one using a 3D printing process or a 3D spraying process.

In some examples, the sub-structures 142 may be cured by heat curing or ultraviolet curing.

In some other examples, as shown in FIG. 3D, the sub-structures 142 may be formed by using a glue spreading process.

For example, a material for forming the sub-structures 142 may be disposed in a glue spreading device 106. A glue discharging speed and a moving speed of the glue spreading device 106 are controlled, so that in any direction away from the light-emitting element 130, the heights of the sub-structures 142 are able to be increased, which simplifies the manufacturing steps of the sub-structures 142, and reduces the production cost.

For example, the material for forming the sub-structures 142 includes a material with high thixotropic properties, such as a highly thixotropic glue. The material with high thixotropic properties is able to be rapidly patterned, which simplifies the manufacturing process of the sub-structures 142.

In some embodiments, as shown in FIGS. 2A and 2B, in any two sub-structures 142 in the light adjustment portion 140 in any direction away from the light-emitting element 130, an area of an orthographic projection, on the substrate 110, of a sub-structure 142 closer to the light-emitting element 130 is less than an area of an orthographic projection, on the substrate 110, of a sub-structure 142 farther from the light-emitting element 130.

It will be understood that in any two sub-structures 142 in the light adjustment portion 140 in any direction away from the light-emitting element 130, the area of the orthographic projection, on the substrate 110, of the sub-structure 142 closer to the light-emitting element 130 is less than the area of the orthographic projection, on the substrate 110, of the sub-structure 142 farther from the light-emitting element 130. That is, in any direction away from the light-emitting element 130, areas of orthographic projections of sub-structures 142 on the substrate 110 may be gradually increased.

It will be understood that in any direction away from the light-emitting element 130, the areas of the orthographic projections of the sub-structures 142 on the substrate 110 are arranged to be gradually increased, so that the collimating effect of the plurality of sub-structures 142 in the light adjustment portion 140 on light is improved, so as to further reduce the light leakage of the light-emitting substrate 100.

In some examples, the orthographic projection of the sub-structure 142 on the substrate 110 is circular. In any direction away from the light-emitting element 130, the areas of the orthographic projections of the sub-structures 142 on the substrate 110 are gradually increased, which means that in any direction away from the light-emitting element 130, diameters of the orthographic projections of the sub-structures 142 on the substrate 110 are gradually increased.

Figure 4A:
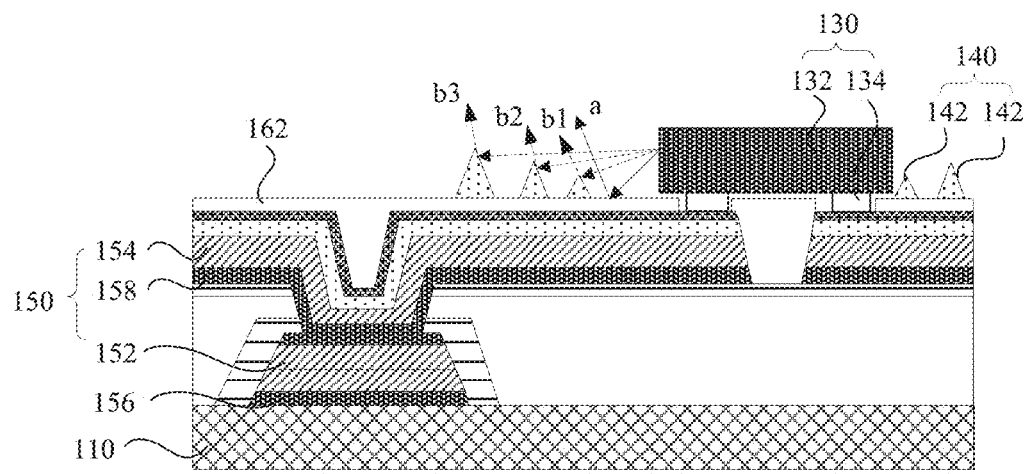
FIG. 4A is a structural diagram of a driving circuit layer, a reflective film and a light-emitting element, in accordance with some embodiments.
Figure 4B:
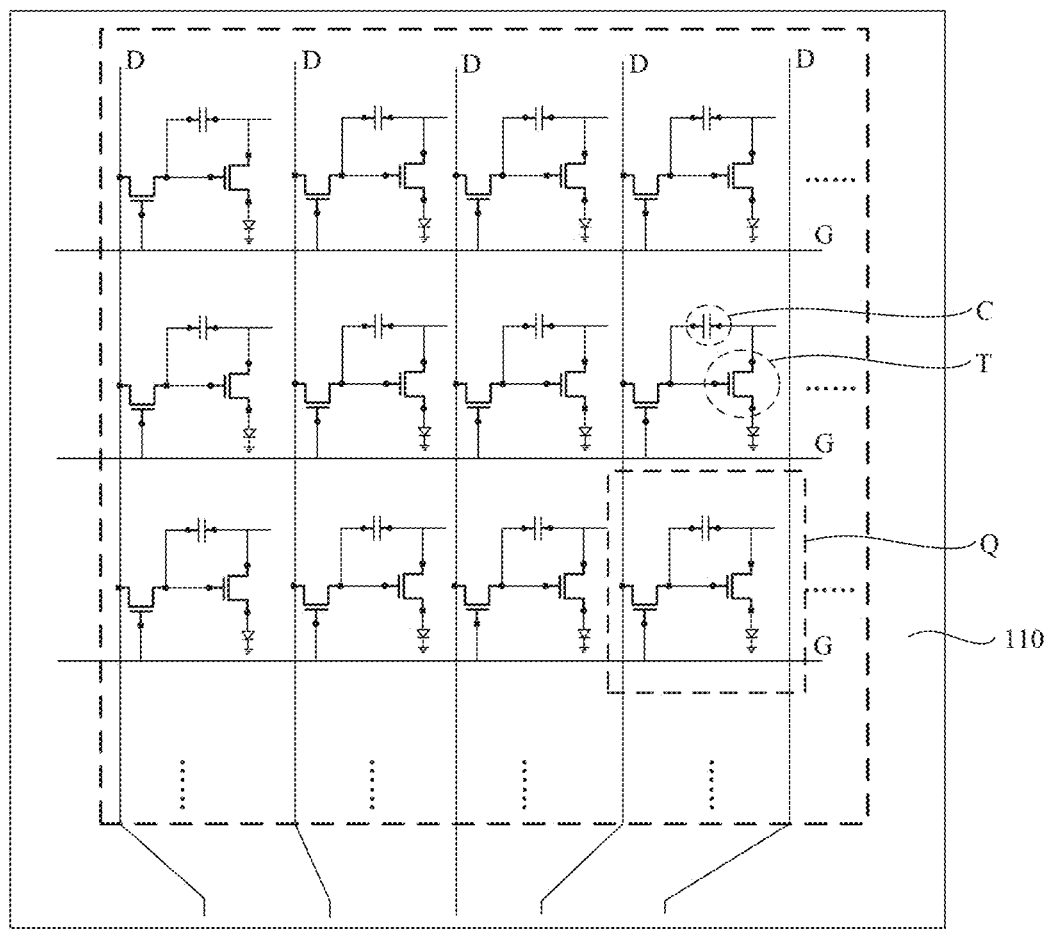
FIG. 4B is a structural diagram of driving circuits, in accordance with some embodiments.
Figure 4C:
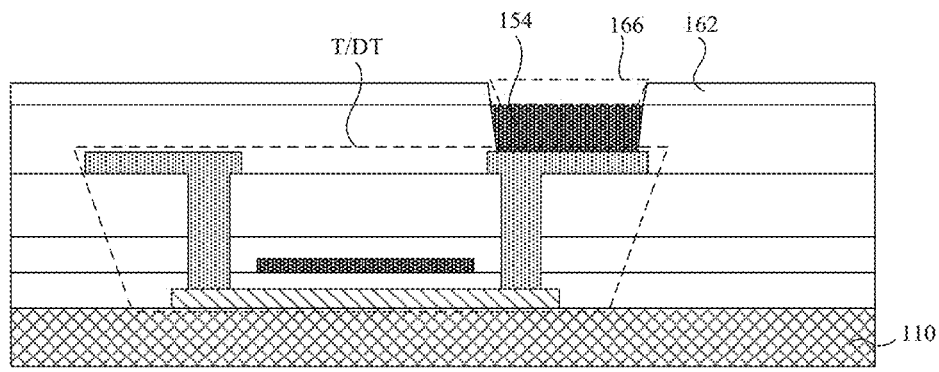
FIG. 4C is a structural diagram of a driving circuit layer and a reflective film, in accordance with some embodiments.

FIG. 4A is a structural diagram of a driving circuit layer, a reflective film and a light-emitting element, in accordance with some embodiments. FIG. 4B is a structural diagram of driving circuits, in accordance with some embodiments. FIG. 4C is a structural diagram of a driving circuit layer and a reflective film, in accordance with some embodiments.

In some embodiments, as shown in FIG. 4A, the light-emitting substrate 100 further includes a driving circuit layer 150 and the reflective film 162. The driving circuit layer 150 is located on the side of the substrate 110. The reflective film 162 is located on a side of the driving circuit layer 150 away from the substrate 110.

In some examples, the driving circuit layer 150 is located on the surface of the substrate 110. In some other examples, as shown in FIG. 4A, the driving circuit layer 150 and the substrate 110 are provided with other film layer structure(s) therebetween, such as first adhesive layer(s) 156, so as to improve a reliability of the connection between the driving circuit layer 150 and the substrate 110.

In some examples, as shown in FIG. 4A, the driving circuit layer 150 includes metal wiring(s) 152 and conductive pad(s) 154 electrically connected to the metal wiring(s) 152. For example, the metal wiring 152 is located on the side of the substrate 110, and the conductive pad 154 is located on a side of the metal wiring 152 away from the substrate 110. It will be understood that there are a plurality of conductive pads 154.

In some examples, as shown in FIG. 4A, the metal wiring 152 and the conductive pad 154 are provided with other film layer structure(s) therebetween, such as a second adhesive layer 158, so as to improve a reliability of the electrical connection between the metal wiring 152 and the conductive pad 154. In some other examples, the conductive pad 154 is attached to a surface of the metal wiring 152 away from the substrate 110.

In some examples, as shown in FIG. 4B, the light-emitting substrate 100 further includes driving circuits Q. A driving circuit Q is located between the substrate 110 and a conductive pad 154, and is electrically connected to the conductive pad 154, so that a driving signal may be transmitted to the conductive pad 154. The conductive pad 154 is electrically connected to a light-emitting element 130, and the driving signal may be transmitted to the light-emitting element 130 through the conductive pad 154, so that the light-emitting element 130 is able to emit light under a drive of the driving circuit Q.

For example, as shown in FIG. 4B, the light-emitting substrate 100 includes a plurality of gate lines G and a plurality of data lines D that are all located on the substrate 110, and the driving circuit Q is electrically connected to a gate line G and a data line D. Under a control of a gate scan signal from the gate line G, the driving circuit Q receives a data signal from the data line D to output the driving signal.

In some examples, the driving circuit Q includes thin film transistors (TFTs) T. As shown in FIG. 4C, the thin film transistors T include a driving transistor DT. The driving transistor DT is located between the substrate 110 and the conductive pad 154, and is electrically connected to the conductive pad 154, so as to output the driving signal.

In some examples, the light-emitting substrate 100 further includes a driving chip (also referred to as integrated circuit, IC). The driving chip is electrically connected to the driving circuits Q for controlling the driving circuit Q to provide the driving signal to the light-emitting element 130.

In some examples, as shown in FIG. 4B, the driving circuit Q includes the thin film transistors T and a capacitor C.

The reflective film 162 is located on the side of the driving circuit layer 150. It will be understood that the reflective film 162 functions to reflect light. For example, a material of the reflective film 162 includes photosensitive white ink or thermosetting white ink.

In some examples, the reflective film 162 is located on a surface of the driving circuit layer 150 away from the substrate 110. In some other examples, the reflective film 162 and the driving circuit layer 150 are provided with other film layer structure(s) therebetween, such as an insulating layer for electrical isolation or a planarization layer for planarization of a contact surface.

The reflective film 162 exposes the conductive pads 154. For example, as shown in FIG. 4C, openings 166 may be formed at respective positions of the reflective film 162 by a patterning process, so that the reflective film 162 is able to expose the conductive pads 154. In some examples, an area of the opening 166 is greater than an area of the conductive pad 154, so that the conductive pad 154 is entirely exposed.

As shown in FIG. 4A, the light-emitting element 130 includes a light-emitting portion 132 and pin(s) 134. The pin(s) 134 are electrically connected to the conductive pad 154. It will be understood that the pin(s) 134 are used for receiving the driving signal, so that the light-emitting portion 132 is capable of emitting light due to an action of the driving signal.

It will be understood that since the reflective film 162 is able to expose the conductive pad 154, the pin(s) 134 are able to be electrically connected to the conductive pad 154.

In some examples, there are a plurality of pins 134. For example, the plurality of pins 134 may be electrically connected to the plurality of conductive pads 154. In some examples, the pin 134 and the conductive pad 154 are electrically connected by soldering.

As shown in FIG. 4A, the light-emitting portion 132 is located on a side of the reflective film 162 away from the driving circuit layer 150. It will be understood that the reflective film 162 functions to reflect light. The light-emitting portion 132 is located on the side of the reflective film 162 away from the driving circuit layer 150, so that part of the light emitted from the light-emitting portion 132 is able to be irradiated to the reflective film 162, and is irradiated to the outside of the light-emitting substrate 100 in a direction away from the substrate 110 due to the reflection of the reflective film 162 (as shown by the light ray a in FIG. 4A).

That is, the reflective film 162 is disposed, and the light-emitting portion 132 is disposed on the side of the reflective film 162 away from the driving circuit layer 150, so that the intensity of the light irradiated to the outside of the light-emitting substrate 100 is able to be increased. Thus, the brightness of the light-emitting substrate 100 is increased, and a utilization rate of light is improved, thereby reducing the power consumption of the light-emitting substrate 100.

As shown in FIG. 4A, the plurality of sub-structures 142 in the light adjustment portion 140 are located on a surface of the reflective film 162 away from the driving circuit layer 150. In this way, part of the light emitted from the light-emitting element 130 is able to be irradiated to the plurality of sub-structures 142.

For example, as shown by the light ray b1, the light ray b2 and the light ray b3 in FIG. 4A, the plurality of sub-structures 142 in the light adjustment portion 140 are able to collimate the light, thereby reducing the light leakage of the light-emitting substrate 100.

In some examples, the plurality of sub-structures 142 in the light adjustment portion 140 are attached to the surface of the reflective film 162 away from the driving circuit layer 150.

Figure 5A:
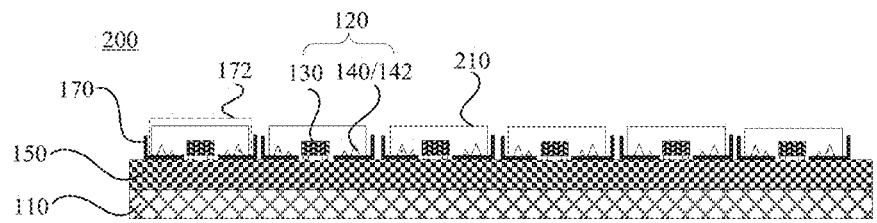
FIG. 5A is a structural diagram of a light-emitting module, in accordance with yet other embodiments.
Figure 5B:
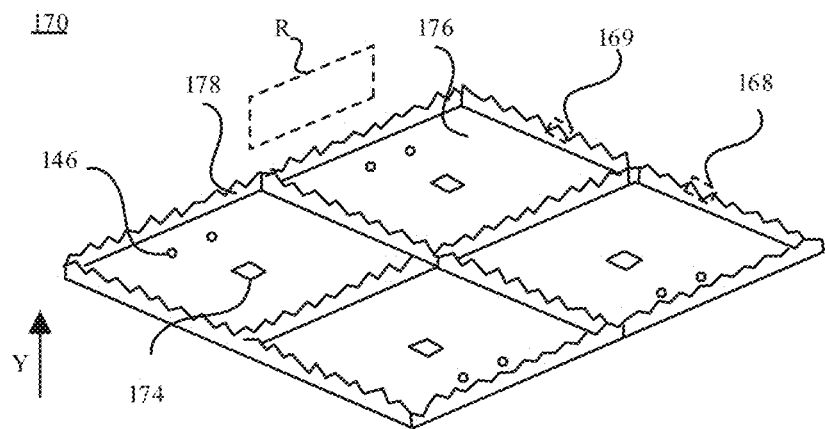
FIG. 5B is a structural diagram of a reflective component, in accordance with some embodiments.
Figure 5C:
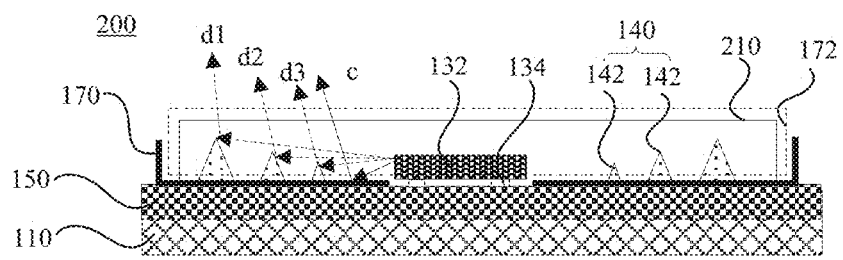
FIG. 5C is a structural diagram of a light-emitting module, in accordance with yet other embodiments.
Figure 5D:
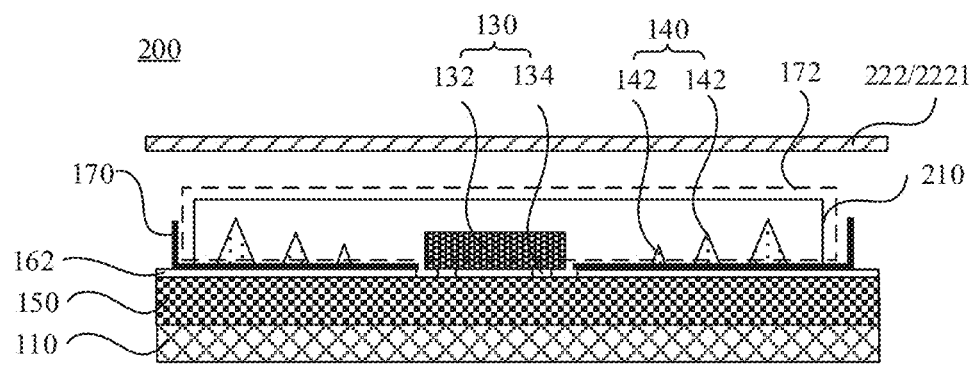
FIG. 5D is a structural diagram of a light-emitting module, in accordance with yet other embodiments.

FIG. 5A is a structural diagram of a light-emitting module, in accordance with yet other embodiments. FIG. 5B is a structural diagram of a reflective component, in accordance with some embodiments. FIG. 5C is a structural diagram of a light-emitting module, in accordance with yet other embodiments. FIG. 5D is a structural diagram of a light-emitting module, in accordance with yet other embodiments.

It can be seen from the above that in some embodiments, the light-emitting substrate 100 includes the driving circuit layer 150 and the reflective film 162, and the reflective film 162 is located on the side of the driving circuit layer 150 away from the substrate 110. In some other embodiments, as shown in FIG. 5A, the light-emitting substrate 100 includes the driving circuit layer 150 and reflective component(s) 170.

The driving circuit layer 150 is located on the side of the substrate 110. The driving circuit layer 150 includes the metal wirings 152 and the conductive pads 154, and the conductive pad 154 is electrically connected to the metal wiring 152. It will be understood that the driving circuit layer 150 is exemplarily described in the above embodiments of the present disclosure, and will not be repeated here.

The light-emitting element 130 includes the light-emitting portion 132 and the pin(s) 134. It will be understood that the light-emitting element 130 is exemplarily described in the embodiments of the present disclosure, and will not be repeated here. The reflective component 170 will be exemplarily described below with reference to FIGS. 5A to 5D.

As shown in FIG. 5A, the reflective component 170 is located on the side of the driving circuit layer 150 away from the substrate 110. In some examples, the reflective component 170 is attached to the surface of the driving circuit layer 150 away from the substrate 110. In some other examples, the reflective component 170 and the driving circuit layer 150 are provided with other film layer structure(s) therebetween.

As shown in FIG. 5A, the reflective component 170 encloses a reflective cavity 172. For example, the reflective cavity 172 may be a box-shaped structure with a rectangular bottom surface, a circular bottom surface, a polygonal bottom surface, or other irregular bottom surface.

It will be understood that an inner wall (i.e., a surface away from the substrate 110) of the reflective component 170 encloses the reflective cavity 172. It will be noted that in FIG. 5A, FIG. 5C, or FIG. 5D, a range shown by the dashed line (i.e., the reflective cavity 172) is spaced apart from the inner wall of the reflective component 170, which is only for convenience of showing the reflective cavity 172, and does not further limit a positional relationship between the reflective cavity 172 and the reflective component 170.

As shown in FIG. 5B, the reflective component 170 has communication hole(s) 174. In some examples, the reflective component 170 may have one or more communication holes 174. For example, the communication hole 174 may be square or circular in shape. The shapes of the communication holes 174 disposed in different reflective components 170 may be the same or different.

As shown in FIG. 5C, the light-emitting portion 132 is located in the reflective cavity 172, and the pin(s) 134 are electrically connected to the conductive pad 154 through the communication hole(s) 174.

In some examples, the shape of the communication hole 174 is matched with a shape of an orthographic projection of the light-emitting element 130 on the substrate 110, so that the pin(s) 134 are able to be electrically connected to the conductive pad 154 through the communication hole 174.

It will be understood that the reflective component 170 is capable of functioning to reflect light. The light-emitting portion 132 is located in the reflective cavity 172, so that part of the light emitted from the light-emitting portion 132 is able to be irradiated to the inner wall of the reflective component 170, and exits from the light-emitting substrate 100 in the direction away from the substrate 110 due to the reflection effect of the reflection member 170 (as shown by the light ray c in FIG. 5C). That is, the reflective component 170 is disposed, so that the intensity of the light irradiated to the outside of the light-emitting substrate 100 is able to be increased. Thus, the brightness of the light-emitting substrate 100 is increased, and the utilization rate of light is improved, thereby reducing the power consumption of the light-emitting substrate 100.

In some examples, a reflective material is applied to the inner wall of the reflective component 170, so that the reflective component 170 is capable of functioning to reflect light. For example, the reflective material may be titanium dioxide or silicon dioxide.

As shown in FIG. 5C, the plurality of sub-structures 142 in the light adjustment portion 140 are disposed in the reflective cavity 172. For example, the plurality of sub-structures 142 in the light adjustment portion 140 are located in the reflective cavity 172.

In some embodiments, as shown in FIG. 5B, the reflective component 170 includes a bottom wall 176 and side walls 178. The bottom wall 176 has the communication hole(s) 174. The plurality of sub-structures 142 in the light adjustment portion 140 are located on the bottom wall 176. An end of the side wall 178 is connected to the bottom wall 176, and another end of the side wall 178 extends from the bottom wall 176 in a direction Y away from the substrate 110. The side walls 178 and the bottom wall 176 enclose the reflective cavity 172.

It will be understood that a main body of the bottom wall 176 has a plate-like structure with a flat surface. The communication hole(s) 174 are disposed in the bottom wall 176, so that the pin(s) 134 of the light-emitting element 130 are able to be electrically connected to the conductive pad 154 through the communication hole(s) 174. For example, the side walls 178 surround the bottom wall 176, so that the side walls 178 and the bottom wall 176 are able to enclose the reflective cavity 172.

In some examples, the side wall 178 and the bottom wall 176 may be of an integral structure, so as to improve a reliability of the connection between the side wall 178 and the bottom wall 176.

The reflective component 170 is arranged to include the bottom wall 176 and the side walls 178, so that the bottom wall 176 and the side walls 178 are able to enclose the reflective cavity 172. Thus, light irradiated to the side walls 178 and light irradiated to the bottom wall 176 are able to be irradiated to the outside of the light-emitting substrate 100 due to the reflection effect, so that the brightness of the light-emitting region 102 is increased, and the power consumption of the light-emitting substrate 100 is reduced.

The plurality of sub-structures 142 in the light adjustment portion 140 are located on the bottom wall 176. For example, as shown by the light ray d1, the light ray d2 and the light ray d3 in FIG. 5C, part of the light emitted from the light-emitting element 130 is able to be irradiated to the plurality of sub-structures 142. The plurality of sub-structures 142 in the light adjustment portion 140 are capable of functioning to collimate the light, thereby reducing the light leakage of the light-emitting substrate 100.

In some examples, the plurality of sub-structures 142 in the light adjustment portion 140 are attached to the bottom wall of the reflective cavity 172.

It will be understood that the reflective component 170 is disposed, so that not only the brightness of the light-emitting substrate 100 is able to be increased to improve the utilization rate of light and reduce the power consumption of the light-emitting substrate 100, but also the light leakage of the light-emitting substrate 100 is able to be reduced, so as to further improve the light-emitting performance of the light-emitting substrate 100.

In some examples, as shown in FIG. 5A, there are a plurality of reflective components 170. A light-emitting assembly 120 (including light-emitting element(s) 130 and a light adjustment portion 140) is located in a reflective cavity 172 formed by a reflective component 170. That is, the side walls 178 surround a light-emitting assembly 120.

In this way, the side walls 178 are able to reflect light emitted from each light-emitting element 130 in the light-emitting assembly 120 to reduce an intensity of light irradiated to other reflective cavity 172, i.e., to reduce the intensity of the light irradiated to other light-emitting region 102. Thus, the light leakage of the light-emitting substrate 100 is able to be reduced, so as to further improve the light-emitting performance of the light-emitting substrate 100.

In some other examples, there is a single reflective component 170. The plurality of light-emitting assemblies 120 (each including light-emitting element(s) 130 and a light adjustment portion 140) are located in the reflective cavity 172 formed by the reflective component 170. That is, the side walls 178 surround the plurality of light-emitting assemblies 120, which simplifies the structure of the light-emitting substrate 100, and reduces the cost of the light-emitting substrate 100.

In yet other embodiments, as shown in FIG. 5D, the light-emitting substrate 100 includes both the reflective film 162 and the reflective component(s) 170. The reflective film 162 is located between the driving circuit layer 150 and the reflective component(s) 170.

The reflective film 162 is disposed between the driving circuit layer 150 and the reflective component(s) 170, so that the reflection effect on light is further improved to increase the intensity of the light irradiated to the outside the light-emitting substrate 100, thereby increasing the brightness of the light-emitting substrate 100 and reducing the power consumption of the light-emitting substrate 100.

It can be seen from the above that the reflective film 162 has the openings 166. In some examples, in a case where the light-emitting module 200 includes both the reflective film 162 and the reflective component(s) 170, the area of the opening 166 in the reflective film 162 is equal to or approximately equal to an area of the communication hole 174 in the reflective component 170, so that the opening 166 and the communication hole 174 are able to expose the conductive pad 154, and thus the pin(s) 134 of the light-emitting element 130 are able to be electrically connected to the conductive pad 154.

In some other examples, the area of the communication hole 174 may be slightly greater than the area of the opening 166.

In some other examples, an included angle between a side wall of the communication hole 174 and a surface of the reflective component 170 proximate to the substrate 110 is in a range of 30° to 90°, which increases an opening area of the communication hole 174 to improve a convenience of connecting the pin(s) 134 of the light-emitting element 130 to the conductive pad 154.

For example, the included angle between the side wall of the communication hole 174 and the surface of the reflective component 170 proximate to the substrate 110 may be 45°, 60°, or 75°.

In some embodiments, as shown in FIG. 5B, the side wall 178 is perpendicular to the bottom wall 176.

The side wall 178 is arranged to be perpendicular to the bottom wall 176, so that the reflection effect on the light emitted from the light-emitting portion 132 is further improved, so as to reduce the intensity of the light irradiated to other reflective cavity 172, i.e., to reduce the intensity of the light irradiated to other light-emitting region 102, thereby reducing the light leakage of the light-emitting substrate 100 to further improve the light-emitting performance of the light-emitting substrate 100.

In some embodiments, as shown in FIG. 5B, an orthographic projection of an edge of the side wall 178 away from the bottom wall 176 on a reference plane R parallel to this side wall 178 is in a shape of a plurality of curves that are continuous or a plurality of broken lines that are continuous.

It will be understood that in a case where the light-emitting assembly 120 (including the light-emitting element(s) 130 and the light adjustment portion 140) is located in the reflective cavity 172 formed by the reflective component 170, the side walls 178 enclose the light-emitting assembly 120.

The orthographic projection of the edge of the side wall 178 away from the bottom wall 176 on the reference plane parallel to this side wall 178 is set to be in the shape of the plurality of curves that are continuous or the plurality of broken lines that are continuous. That is, a surface of an end of the side wall 178 away from the bottom wall 176 is a curved surface or a broken line surface. In this way, as shown in FIG. 5B, the end of the side wall 178 away from the bottom wall 176 has cutouts 168.

It will be understood that part of the light emitted from the light-emitting portion 132 is able to be irradiated to the outside of the light-emitting substrate 100 in the direction away from the substrate 110 due to the reflection effect of the side walls 178 and the bottom wall 176, and another part of the light is able to be irradiated to other light-emitting region 102 through the cutouts 168.

In this way, on the basis of reducing the light leakage of the light-emitting substrate 100, a brightness at a position between two adjacent light-emitting regions 102 is able to be increased to improve a brightness between two adjacent light-emitting elements 130, so that the bright and dark regions of the light-emitting substrate 100 that can be perceived by naked eyes is weakened, thereby improving a light-emitting uniformity of the light-emitting substrate 100.

In some examples, the orthographic projection of the edge of the side wall 178 away from the bottom wall 176 on the reference plane parallel to this side wall 178 is in a shape of a plurality of regular curves that are continuous or a plurality of regular broken lines that are continuous, e.g., is wavy or saw-toothed, or is wavy and saw-toothed.

In some other examples, the orthographic projection of the edge of the side wall 178 away from the bottom wall 176 on the reference plane parallel to this side wall 178 is in a shape of a plurality of irregular curves that are continuous or a plurality of irregular broken lines that are continuous.

In some examples, an orthographic projection of the side wall 178 on the reference plane parallel to this side wall 178 is in a shape of a triangle, a rectangle, a semicircle or a semiellipse. It will be understood that since the orthographic projection of the edge of the side wall 178 away from the bottom wall 176 includes the plurality of curves that are continuous or the plurality of broken lines that are continuous, the orthographic projection of the side wall 178 on the reference plane parallel to this side wall 178 is in a shape of an approximate triangle, an approximate rectangle, an approximate semicircle or an approximate semiellipse, whose edge is a curve or a broken line.

In an example where the orthographic projection of the edge of the side wall 178 away from the bottom wall 176 on the reference plane parallel to this side wall 178 is sawtoothed, for example, as shown in FIG. 5B, a sawtooth structure may be regarded as a sawtooth portion 169. It will be understood that the sawtooth portion 169 includes two inclined edges and a bottom edge (i.e., a line connecting the two inclined edges).

In some examples, an orthographic projection of the sawtooth portion 169 on the reference plane parallel to the side wall 178 is in a shape of a left-right symmetrical triangle. That is, an included angle between each of the two inclined edges and the bottom edge of the sawtooth portion 169 is equal or approximately equal.

In some other examples, the orthographic projection of the sawtooth portion 169 on the reference plane parallel to the side wall 178 is in a shape of a left-right asymmetrical triangle. That is, the included angle between each of the two inclined edges and the bottom edge of the sawtooth portion 169 is not equal.

For example, an included angle between an included edge and a bottom edge of the sawtooth portion 169 is in a range of 30° to 60°, inclusive, e.g., 45°, 50°, or 55°. An included angle between another included edge and the bottom edge of the sawtooth portion 169 is in a range of 80° to 90°, inclusive, e.g., 82°, 85°, or 87°.

In some examples, a length of the bottom edge of the sawtooth portion 169 is in a range of 2 mm to 4 mm, inclusive. A height of the sawtooth portion 169 (i.e., a distance between the bottom edge of the sawtooth portion 169 and a vertex of the sawtooth portion 169) is in a range of 1 mm to 2 mm, inclusive.

For example, the length of the bottom edge of the sawtooth portion 169 may be 2.5 mm, 3 mm, or 3.5 mm. The height of the sawtooth portion 169 may be 1.2 mm, 1.5 mm, or 1.8 mm.

In some embodiments, as shown in FIGS. 2A and 2B, in any direction away from the light-emitting element 130, sub-structures 142 in the light adjustment portion 140 are located on a straight line.

It will be understood that in any direction away from the light-emitting element 130, the sub-structures 142 in the light adjustment portion 140 are arranged to be located on the straight line, so that the structural regularity of the light adjustment portion 140 is able to be improved to improve the collimating effect on light, thereby reducing the intensity of the light irradiated to other light-emitting region 102 during the local dimming, so as to reduce the light leakage of the light-emitting substrate 100 and improve the light-emitting performance of the light-emitting substrate 100.

Moreover, the sub-structures 142 in the light adjustment portion 140 are arranged to be located on the straight line to improve the structural regularity of the light adjustment portion 140, which facilitates the production and processing of the light adjustment portion 140, so as to improve the production efficiency.

In some embodiments, a shape of each of at least one sub-structure 142 is one of a cone, a pyramid, a truncated cone, a truncated pyramid and a hemisphere.

It will be understood that the shapes of the plurality of sub-structures 142 in the light adjustment portion 140 may be the same or different. The shape of each of the at least one sub-structure 142 is arranged to be one of the cone, the pyramid, the truncated cone, the truncated pyramid and the hemisphere, so that different use requirements is met, and the applicability of the light adjustment portion 140 is improved.

For example, the hemisphere includes a semicircular sphere, a semiellipsoid and other approximate structures.

In some embodiments, a height of each of the plurality of sub-structures 142 in the light adjustment portion 140 is in a range of 250 μm to 1,000 μm, inclusive.

The height of each of the plurality of sub-structures 142 is set to be in the range of 250 μm to 1,000 μm, inclusive, so that the sub-structure 142 is prevented from having an overlarge height (e.g., greater than 1,000 μm), and thus the sub-structure 142 is prevented from occupying an overlarge space, which facilitates the thinning of the light-emitting substrate 100. Moreover, the collimating effect of the sub-structure 142 on the light is prevented from being affected due to a too small height (e.g., less than 250 μm) of the sub-structure 142, so that the brightness uniformity of the light-emitting substrate 100 is further improved.

In some examples, the height of each of the plurality of sub-structures 142 may be in a range of 300 μm to 950 μm, 350 μm to 900 μm, 400 μm to 800 μm, or 500 μm to 700 μm. For example, the height of the sub-structure 142 may be 300 μm, 400 μm, 500 μm, 600 μm, or 750 μm.

In some embodiments, in any direction away from the light-emitting element 130, an absolute value of a height difference between any two adjacent sub-structures 142 in the light adjustment portion 140 is in a range of 200 μm to 300 μm, inclusive.

It can be seen from the above that in any two sub-structures 142 in the light adjustment portion 140 in any direction away from the light-emitting element 130, the height of the sub-structure 142 closer to the light-emitting element 130 is less than the height of the sub-structure 142 farther from the light-emitting element 130. That is, in any direction away from the light-emitting element 130, the heights of the sub-structures 142 may be gradually increased.

Therefore, in any direction away from the light-emitting element 130, the absolute value of the height difference between any two adjacent sub-structures 142 in the light adjustment portion 140 is set to be in the range of 200 μm to 300 μm, inclusive, which prevents any two adjacent sub-structures 142 in the light adjustment portion 140 from having a too large or too small height difference, so that in any direction away from the light-emitting element 130, the heights of the sub-structures 142 are able to be slowly increased. Thus, the regularity of the light adjustment portion 140 is improved to improve the collimating effect of the light adjustment portion 140 on the light, thereby reducing the light leakage of the light-emitting substrate 100 to improve the light-emitting performance of the light-emitting substrate 100.

In some examples, in any direction away from the light-emitting element 130, the absolute value of the height difference between any two adjacent sub-structures 142 in the light adjustment portion 140 may be 220 μm, 250 μm, 280 μm, or 290 μm.

In some embodiments, in any direction away from the light-emitting element 130, in the light adjustment portion 140, an absolute value of a height difference between any two adjacent sub-structures 142 is equal to an absolute value of a height difference between any other two adjacent sub-structures 142.

It will be understood that in any direction away from the light-emitting element 130, in the light adjustment portion 140, the absolute value of the height difference between any two adjacent sub-structures 142 is set to be equal to the absolute value of the height difference between any other two adjacent sub-structures 142, so that in any direction away from the light-emitting element 130, the heights of the sub-structures 142 are able to be gradually increased in the arithmetic progression.

In this way, the structural regularity of the light adjustment portion 140 is further improved to improve the collimating effect of the light adjustment portion 140 on the light, thereby reducing the light leakage of the light-emitting substrate 100 to improve the light-emitting performance of the light-emitting substrate 100.

It will be understood that in any direction away from the light-emitting element 130, in the light adjustment portion 140, the absolute value of the height difference between any two adjacent sub-structures 142 may be set to be equal to or approximately equal to the absolute value of the height difference between any other two adjacent sub-structures 142.

In some examples, the light-emitting module 200 generally includes a plurality of layers of films. In some implementations, the plurality of layers of films are usually combined, so that the films are able to be thinned and multifunctional to reduce the light mixing distance H, which facilitates the thinning of the light-emitting substrate 100.

Figure 5E:
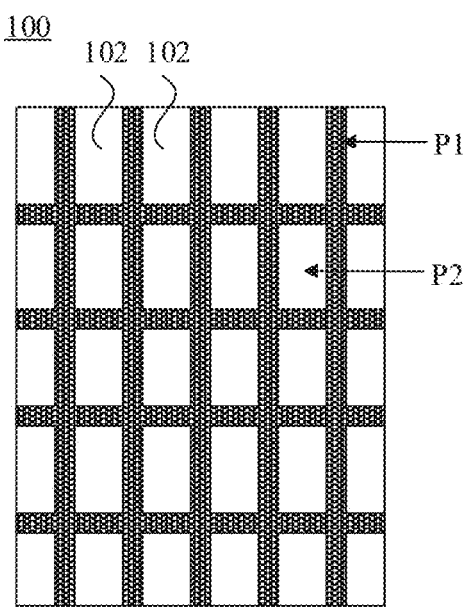
FIG. 5E is a structural diagram of a light-emitting substrate, in accordance with yet other embodiments.
Figure 5F:
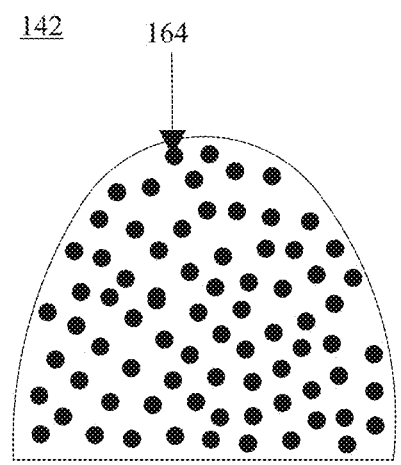
FIG. 5F is a structural diagram of a sub-structure, in accordance with some other embodiments.
Figure 5G:
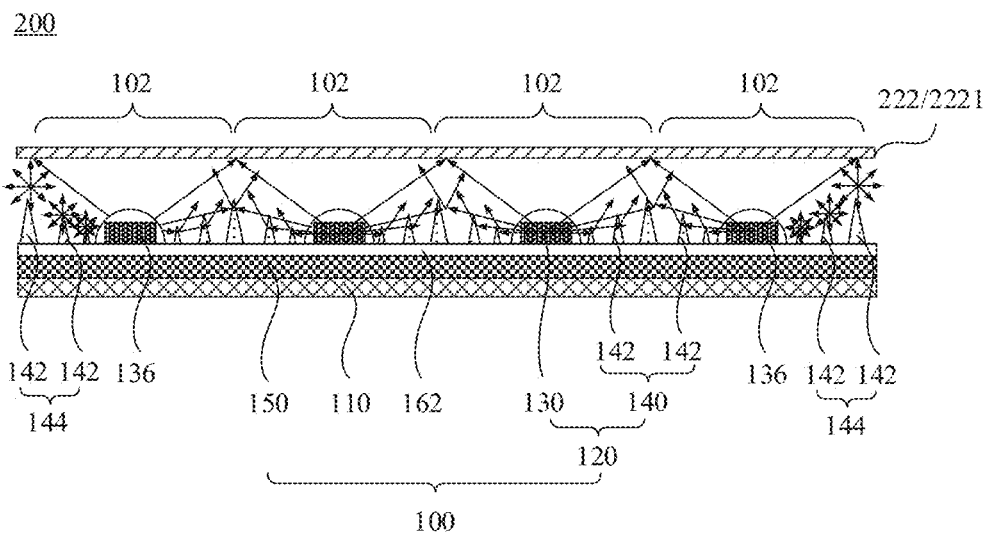
FIG. 5G is a structural diagram of a light-emitting module, in accordance with yet other embodiments.

FIG. 5E is a structural diagram of a light-emitting substrate, in accordance with yet other embodiments. FIG. 5F is a structural diagram of a sub-structure, in accordance with some other embodiments. FIG. 5G is a structural diagram of a light-emitting module, in accordance with yet other embodiments.

For example, as shown by the arrow directions in FIG. 1A, the light emitted from the light-emitting element 130 is irradiated to the outside in a cone shape or a cone-like shape, so that a brightness between two adjacent light-emitting elements 130 (i.e., a brightness at an edge of each light-emitting region 102) is less than a brightness at a center of each light-emitting region 102. When the light mixing distance H is reduced, a difference in brightness at the edge and the center of each light-emitting region 102 is increased, which results in an uneven brightness of the light-emitting substrate 100.

For example, as shown in FIG. 5E, in a case where the plurality of light-emitting regions 102 are arranged in the array, the brightness at the position (as shown by the P1 region in FIG. 5E) between two adjacent light-emitting regions 102 is less than the brightness at the center (as shown by the P2 region in FIG. 5E) of each light-emitting region 102, which results in the bright and dark regions of the light-emitting substrate 100 that can be perceived by naked eyes, so that the brightness uniformity of the light-emitting substrate 100 is affected, and the performance of the light-emitting module 200 is affected.

In some embodiments, the brightness uniformity of the light-emitting substrate 100 may be improved by reducing the distance D between two adjacent light-emitting elements 130, by increasing a light-emitting angle α of the light-emitting element 130 (e.g., increasing the light-emitting angle α to 175° or more), by increasing the light mixing distance H, or by providing a diffuser plate or a light uniformizing film.

However, it is discovered through research that the distance D between two adjacent light-emitting elements 130 is reduced, so that the number of the light-emitting elements 130 is increased under a condition that an area of the display region 104 is unchanged, and thus the cost of the light-emitting substrate 100 is increased. The light-emitting angle α of the light-emitting element 130 is increased, so that the manufacturing complexity and difficulty of the light-emitting elements 130 and the cost of the light-emitting elements 130 are increased, and thus the cost of the light-emitting substrate 100 is also increased.

The light mixing distance H of the light-emitting substrate 100 is increased, so that the thickness of the light-emitting substrate 100 is increased. The diffuser plate or the light uniformizing film is disposed, so that a haze of the light-emitting substrate 100 is increased to reduce a light transmittance, thereby reducing the brightness of the light-emitting region 102 and increasing the power consumption of the light-emitting substrate 100. Moreover, the diffuser plate or the light uniformizing film is disposed, so that the thickness of the light-emitting substrate 100 is also increased, which is not conducive to the thinning of the light-emitting substrate 100.

In order to improve the brightness uniformity of the light-emitting substrate 100, in some embodiments, as shown in FIG. 5F, the light-emitting substrate 100 further includes diffusion particles 164. The diffusion particles 164 are located in at least one sub-structure 142.

It can be seen from the above that the plurality of sub-structures 142 in the light adjustment portion 140 surround the light-emitting element(s) 130. Therefore, the diffusion particles 164 are arranged to be located in the at least one sub-structure 142, as shown by the arrow directions in FIG. 5G, part of the light directly emitted from the light-emitting element 130 is able to be irradiated to the sub-structures 142 to be scattered by the diffusion particles 164 in the at least one sub-structure 142. That is, the light is able to be diffusely reflected by the diffusing particles 164.

The scattered light propagates in a plurality of different directions, so that on the basis that the plurality of sub-structures 142 have the collimating effect on the light, an intensity of light irradiated to the edge of the light-emitting region 102 is increased to a certain extent. That is, the brightness at the position between two adjacent light-emitting regions 102 is increased, which reduces the difference in brightness at the edge and the center of the light-emitting region 102 to improve the brightness uniformity of the light-emitting regions 102, thereby improving the brightness uniformity of the light-emitting substrate 100 to weaken the bright and dark regions of the light-emitting substrate 100.

In some examples, each sub-structure 142 is provided with diffusion particles 164 therein. Since the plurality of sub-structures 142 surround the light-emitting element(s) 130, the light emitted from the light-emitting element 130 in various directions is able to be scattered, which improves the scattering effect on the light. Therefore, the brightness at the position between adjacent light-emitting regions 102 in the plurality of light-emitting regions 102 arranged in the array is increased, so that the bright and dark regions of the light-emitting substrate 100 are further weakened.

The diffusion particles 164 are disposed to scatter the light emitted from the light-emitting element 130, so as to increase the brightness between two adjacent light-emitting regions 102 and weaken the bright and dark regions of the light-emitting substrate 100, so that a smaller light mixing distance H is able to be set, and there is no need to dispose the diffuser plate or the light uniformizing film, which facilitates the thinning of the light-emitting substrate 100, and improves the applicability of the light-emitting substrate 100.

It will be understood that as shown in FIG. 5G, the sub-structures 142 are located between the reflective film 162 and the color conversion film 222. The diffusion particles 164 are located in the at least one sub-structure 142, so that the diffusion particles 164 are also located between the reflective film 162 and the color conversion film 222.

Thus, there is no need to provide an additional space to accommodate the diffusion particles 164, which further facilitates the thinning of the light-emitting substrate 100.

Moreover, the sub-structures 142 are disposed to scatter the light, so as to improve the brightness between two adjacent light-emitting regions 102 and weaken the bright and dark regions of the light-emitting substrate 100, there is no need to increase the number of the light-emitting elements 130, and there is no need to increase the light-emitting angle α of the light-emitting element 130, which reduces the cost of the light-emitting substrate 100.

In addition, the diffusion particles 164 fully utilize the light irradiated to the position between two adjacent light-emitting regions 102 to weaken the bright and dark regions of the light-emitting substrate 100, which has little influence on the brightness of the light-emitting region 102, and reduces the power consumption of the light-emitting substrate 100.

For example, the sub-structure 142 is made of a transparent material or a translucent material, so that the light is able to be irradiated to the diffusion particles 164 located in the sub-structure 142.

In some examples, a light transmittance of the sub-structure 142 is in a range of 50% to 100%, inclusive. For example, the light transmittance of the sub-structure may be 60%, 70%, 80%, or 90%. It will be understood that the light transmittance of the sub-structure 142 is a ratio of an intensity of light passing through the sub-structure 142 to an intensity of light irradiated to the sub-structure 142.

For example, a material of the sub-structure 142 includes resin or glue. A material of the diffusion particles 164 includes silicon dioxide or titanium dioxide.

For example, in each of the sub-structures 142, a mass ratio of the diffusion particles 164 (i.e., a ratio of a weight of diffusion particles 164 in a sub-structure 142 to a weight of this sub-structure 142) may be the same or different.

In some examples, the mass ratio of the diffusion particles 164 is 15%.

In the light-emitting substrate 100 provided in the embodiments of the present disclosure, the diffusion particles 164 are disposed in the at least one sub-structure 142, so that the diffusion particles 164 are able to scatter the light to achieve a better light mixing effect at a smaller light mixing distance H, so as to improve the brightness uniformity of the light-emitting region 102. Thus, the light-emitting substrate 100 is able to have a higher color contrast and more prominent color display, which is conducive to realizing an ultra-thin design, a high color rendering performance and an energy saving performance of a terminal product (e.g., mobile phone or computer).

It can be seen from the above that in any two sub-structures 142 in the light adjustment portion 140 in any direction away from the light-emitting element 130, the height of the sub-structure 142 closer to the light-emitting element 130 is less than the height of the sub-structure 142 farther from the light-emitting element 130. Moreover, in any two sub-structures 142 in the light adjustment portion 140 in any direction away from the light-emitting element 130, the area of the orthographic projection, on the substrate 110, of the sub-structure 142 closer to the light-emitting element 130 is less than the area of the orthographic projection, on the substrate 110, of the sub-structure 142 farther from the light-emitting element 130.

That is, in any direction away from the light-emitting element 130, the heights of the sub-structures 142 in the light adjustment portion 140 may be gradually increased, and the areas of the orthographic projections of the sub-structures 142 on the substrate 110 may also be gradually increased. In this way, in any direction away from the light-emitting element 130, volumes of the sub-structures 142 in the light adjustment portion 140 may be gradually increased. It will be understood that the larger the volume of the sub-structure 142, the more diffusion particles 164 can be accommodated, and the better the scattering effect on the light.

In this way, the scattering effect on the light irradiated to the edge of the light-emitting region 102 is further improved, and the light mixing effect between two adjacent light-emitting elements 130 is improved, so that the brightness at the position between two adjacent light-emitting regions 102 is increased, thereby weakening the bright and dark stripes of the light-emitting substrate 100 to improve the brightness uniformity of the light-emitting substrate 100.

It can be seen from the above that as shown in FIG. 1A, the light-emitting substrate 100 has the display region 104. In some embodiments, as shown in FIG. 2G, a brightness of a light-emitting element 130e proximate to an edge of the display region 104 is greater than a brightness of a light-emitting element 130 (e.g., the light-emitting element 130a or the light-emitting element 130b) located at another position of the display region 104.

It will be understood that as shown in FIG. 2G, when light emitted from the light-emitting element 130e is irradiated to a light-emitting region 102e, the light is not easy to be mixed with light emitted from other light-emitting elements 130, so that the brightness at the edge of the display region 104 (i.e., a brightness of the light-emitting region 102e) is less than the brightness at another position of the display region 104.

Therefore, the brightness of the light-emitting element 130e proximate to the edge of the display region 104 is set to be greater than the brightness of the light-emitting element 130 located at another position of the display region 104, so that an intensity of light irradiated to the edge of the display region 104 is able to be increased, so as to increase the brightness at the edge of the display region 104 (i.e., the brightness of the light-emitting region 102e), thereby improving a brightness uniformity of the display region 104 to improve the brightness uniformity of the light-emitting substrate 100.

It will be understood that the light-emitting region 102e is only used for describing a light-emitting region 102 proximate to the edge of the display region 104, the light-emitting element 130e is only used for describing a light-emitting element 130 proximate to the edge of the display region 104, and the light-emitting region 102 and the light-emitting element 130 are not further limited.

In some examples, the brightness of the light-emitting element 130e may be increased by increasing a current flowing through the light-emitting element 130e.

It can be seen from the above that the light-emitting module 200 provided in the embodiments of the present disclosure includes the light-emitting substrate 100. In some embodiments, as shown in FIG. 5A, the light-emitting module 200 further includes at least one lens 210. The at least one lens 210 is located on a side of the plurality of light-emitting assemblies 120 away from the substrate 110.

In some examples, as shown in FIG. 5A, the lens 210 covers the light-emitting assembly 120. In some examples, there are a plurality of lenses 210, and a lens 210 covers a light-emitting assembly 120.

In some other examples, there is a single lens 210, and this lens 210 covers the plurality of light-emitting assemblies 120.

It will be understood that the at least one lens 210 is arranged to be located on the side of the plurality of light-emitting assemblies 120 away from the substrate 110, so that the light emitted from the light-emitting element 130 is able to be irradiated to the lens 210, and is reflected or refracted by the lens 210.

That is, by arranging the lens 210, the propagation direction of the light emitted from the light-emitting element 130 is able be changed to increase the brightness between two adjacent light-emitting elements 130, so as to improve the brightness uniformity of each light-emitting region 102, so that the bright and dark regions of the light-emitting substrate 100 is weakened to improve the brightness uniformity of the light-emitting substrate 100, thereby improving the brightness uniformity of the light-emitting module 200.

It can be seen from the above that the light-emitting substrate 100 includes the reflective component(s) 170, and positional relationship(s) between the reflective component(s) 170 and the lens(es) 210 will be exemplarily described below.

In some examples, there are a plurality of reflective components 170, and there are also a plurality of lenses 210. As shown in FIG. 5A, a light-emitting assembly 120 (including light-emitting element(s) 130 and a light adjustment portion 140) is located in a reflective cavity 172 formed by a reflective component 170, and a lens 210 is also located in a reflective cavity 172. That is, the side walls 178 surround a light-emitting assembly 120 and a lens 210.

In this way, the light reflected by the reflective component 170 is able to be irradiated to the lens 210, and is irradiated to the outside of the light-emitting module 200 through the lens 210, thereby further reducing the crosstalk between two adjacent light-emitting regions 102 to improve the brightness of the light-emitting module 200.

In some other examples, there are a plurality of reflective components 170, and there is a single lens 210. The light-emitting assembly 120 (including the light-emitting element(s) 130 and the light adjustment portion 140) is located in a reflective cavity 172 formed by a reflective component 170. A surface of the lens 210 proximate to the substrate 110 has a plurality of third recesses, and the side walls 178 of each reflective component 170 are embedded in a third recess, so that the lens 210 is able to cover the plurality of reflective components 170 and the plurality of light-emitting assemblies 120.

In yet other examples, there is a single reflective component 170, and there is also a single lens 210. The plurality of light-emitting assemblies 120 (each including the light-emitting element(s) 130 and the light adjustment portion 140) are located in a reflective cavity 172 formed by this reflective component 170. The lens 210 is also located in the reflective cavity 172 formed by this reflective component 170, and covers the plurality of light-emitting assemblies 120.

In yet other examples, there is a single reflective component 170, and there are a plurality of lenses 210. The plurality of light-emitting assemblies 120 (each including the light-emitting element(s) 130 and the light adjustment portion 140) are located in a reflective cavity 172 formed by this reflective component 170. The plurality of lenses 210 are also located in the reflective cavity 172 formed by this reflective component 170, and a lens 210 covers a light-emitting assembly 120.

In some examples, as shown in FIG. 5B, limiting hole(s) 146 are provided in the bottom wall 176 of the reflective component 170. The lens 210 has limiting post(s). The limiting post is able to pass through the limiting hole 146 to be connected to the driving circuit layer 150 or the substrate 110, so as to limit the lens 210, so that the lens 210 is prevented from shifting relative to the light-emitting assembly 120, thereby improving the reliability of the light-emitting module 200.

In some examples, there are a plurality of limiting holes 146, and the number of the limiting posts is equal to the number of the limiting holes 146. For example, the number of the limiting holes 146 is two, three, or four. In some examples, the bottom wall 176 is square in shape. A distance between the limiting hole 146 and an edge of the bottom wall 176 corresponding to the limiting hole 146 is one-sixth of a side length of the bottom wall 176.

Figure 6A:
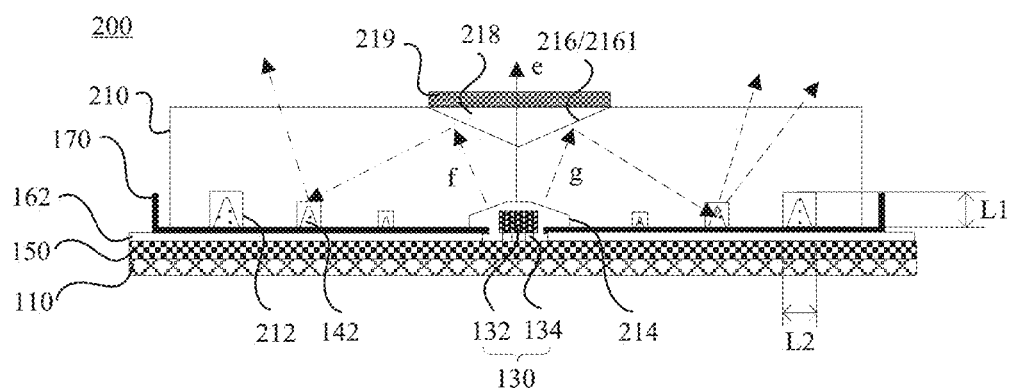
FIG. 6A is a structural diagram of a light-emitting module, in accordance with yet other embodiments.

FIG. 6A is a structural diagram of a light-emitting module, in accordance with yet other embodiments.

In some embodiments, each of the at least one lens 210 is configured to have at least one first recess 212 in a surface thereof proximate to the substrate 110. At least a portion of each of at least one sub-structure 142 in the light adjustment portion 140 is embedded in a first recess 212.

It will be understood that the first recess 212 is disposed in a direction from the substrate 110 to the lens 210. In a case where there are a plurality of first recesses 212, depths L1 of the plurality of first recesses 212 may be the same or different, and widths L2 of the plurality of first recesses 212 may be the same or different.

For example, the first recess 212 may be in a shape of a rectangular parallelepiped, a cylinder, a cone or in other irregular shape. In the case where there are the plurality of first recesses 212, the shapes of the plurality of first recesses 212 may be the same or different.

In some examples, at least a portion of a single sub-structure 142 in the light adjustment portion 140 is embedded in a first recess 212.

In some other examples, at least a portion of each of some (two or more) of the plurality of sub-structures 142 in the light adjustment portion 140 is embedded in a first recess 212.

In some examples, as shown in FIG. 6A, the depth L1 of the first recess 212 is greater than the height of the sub-structure 142 embedded in the first recess 212, so that the sub-structure 142 is able to be entirely embedded in the first recess 212.

In some other examples, in an example where the light-emitting module 200 includes the reflective component(s) 170, the surface of the lens 210 proximate to the substrate 110 and the bottom wall 176 of the reflective component 170 may have a gap therebetween, so that the sub-structure 142 is able to be partially embedded in the first recess 212.

As shown by the light ray g in FIG. 6A, when part of the light emitted from the light-emitting element 130 is irradiated to the first recess 212, the part of the light is able to be scattered by the sub-structure 142. The scattered light propagates in a plurality of different directions, so that the brightness between two adjacent light-emitting elements 130 is improved, so as to improve the brightness uniformity of the light-emitting regions 102 and weaken the bright and dark regions of the light-emitting substrate 100, thereby improving the brightness uniformity of the light-emitting substrate 100 to improve the brightness uniformity of the light-emitting module 200. Moreover, the collimating effect on the light is also able to be realized, thereby reducing the light leakage of the light-emitting module 200.

In addition, the at least a portion of each of the at least one sub-structure 142 is arranged to be embedded in the first recess 212. On one hand, the sub-structure 142 is able to be accommodated in the first recess 212, and thus there is no need to provide an additional accommodating space, which facilitates the thinning of the light-emitting module 200. On another hand, the at least a portion of each of the at least one sub-structure 142 is able to be protected by the first recess 212, thereby improving the reliability of the light-emitting module 200.

In some embodiments, as shown in FIGS. 2A and 2B, each of the at least one first recess 212 is a loop-shaped recess. An orthographic projection of the loop-shaped recess on the substrate 110 surrounds orthographic projection(s) of the light-emitting element(s) 130 on the substrate 110.

For example, the orthographic projection of the first recess 212 on the substrate 110 may be in a shape of a circular loop, a rectangular loop, or other irregular loop. The orthographic projection of the loop-shaped recess on the substrate 110 surrounds the orthographic projection(s) of the light-emitting element(s) 130 on the substrate 110, so that the light emitted from the light-emitting element 130 in all directions is able to be irradiated to the loop-shaped recess, and is scattered by the sub-structure(s) 142 embedded in the loop-shaped recess, thereby further improving the brightness uniformity of the light-emitting module 200.

In addition, it can be seen from the above that the plurality of sub-structures 142 in the light adjustment portion 140 surround the light-emitting element(s) 130. Therefore, the orthographic projection of the loop-shaped recess on the substrate 110 is arranged to surround the orthographic projection(s) of the light-emitting element(s) 130 on the substrate 110, so that at least a portion of each of the plurality of sub-structures 142 surrounding the light-emitting element(s) 130 is able to be embedded in the loop-shaped recess, which facilitates the thinning of the light-emitting module 200.

For example, as shown in FIGS. 2A and 2B, the orthographic projection of the light-emitting element 130 on the substrate 110 is located at a center of the orthographic projection of the loop-shaped recess on the substrate 110.

In some embodiments, there are a plurality of first recesses 212. Heights of sub-structures 142 embedded in a same first recess 212 are equal; and/or areas of orthographic projections of the sub-structures 142 embedded in the same first recess 212 on the substrate 110 are equal.

It will be understood that in a case where there are the plurality of first recesses 212, a part (two or more) of the plurality of sub-structures 142 in the light adjustment portion 140 are embedded in a first recess 212, another part (two or more) of the plurality of sub-structures 142 in the light adjustment portion 140 are embedded in another first recess 212, and yet another part (two or more) of the plurality of sub-structures 142 in the light adjustment portion 140 are embedded in yet another first recess 212.

In some examples, in each first recess 212, two or more sub-structures 142 are embedded, which further improves the scattering effect on the light, thereby improving the brightness uniformity of the light-emitting module 200.

In addition, the heights of the sub-structures 142 embedded in the same first recess 212 are set to be equal, and/or the areas of the orthographic projections of the sub-structures 142 embedded in the same first recess 212 on the substrate 110 are set to be equal, so that the structural regularity of the light adjustment portion 140 is able to be improved to improve the collimating effect on light, thereby reducing the light leakage of the light-emitting module 200.

In some embodiments, as shown in FIG. 6A, there are a plurality of first recesses 212. In any two first recesses 212 in any direction away from the light-emitting element 130, a depth L1 of a first recess 212 closer to the light-emitting element 130 is less than a depth L1 of a first recess 212 farther from the light-emitting element 130; and/or in any two first recesses 212 in any direction away from the light-emitting element 130, a width L2 of a first recess 212 closer to the light-emitting element 130 is less than a width L2 of a first recess 212 farther from the light-emitting element 130.

It will be understood that in any two first recesses 212 in any direction away from the light-emitting element 130, the depth L1 of the first recess 212 closer to the light-emitting element 130 is less than the depth L1 of the first recess 212 farther from the light-emitting element 130. That is, in any direction away from the light-emitting element 130, depths L1 of first recesses 212 are gradually increased.

In any two first recesses 212 in any direction away from the light-emitting element 130, the width L2 of the first recess 212 closer to the light-emitting element 130 is less than the width L2 of the first recess 212 farther from the light-emitting element 130. That is, in any direction away from the light-emitting element 130, widths L2 of first recesses 212 are gradually increased.

It can be seen from the above that in some examples, in any two sub-structures 142 in the light adjustment portion 140 in any direction away from the light-emitting element 130, the height of the sub-structure 142 closer to the light-emitting element 130 is less than the height of the sub-structure 142 farther from the light-emitting element 130. Moreover, in any two sub-structures 142 in the light adjustment portion 140 in any direction away from the light-emitting element 130, the area of the orthographic projection, on the substrate 110, of the sub-structure 142 closer to the light-emitting element 130 is less than the area of the orthographic projection, on the substrate 110, of the sub-structure 142 farther from the light-emitting element 130.

That is, in any direction away from the light-emitting element 130, the heights of the sub-structures 142 in the light adjustment portion 140 may be gradually increased, and the areas of the orthographic projections of the sub-structures 142 on the substrate 110 may also be gradually increased.

Therefore, in any direction away from the light-emitting element 130, depths L1 of first recesses 212 are gradually increased, and/or widths L2 of first recesses 212 are gradually increased, so that the sub-structures 142 may be accommodated in the first recesses 212 to avoid that the sub-structure 142 cannot be embedded in the first recess 212, which facilitates the thinning of the light-emitting module 200.

In some embodiments, as shown in FIG. 6A, each of the at least one lens 210 is configured to have a recessed portion 216 in a surface thereof away from the substrate 110. The orthographic projection of the light-emitting element 130 on the substrate 110 is overlapped with at least a portion of an orthographic projection of the recessed portion 216 on the substrate 110.

It will be understood that the orthographic projection of the light-emitting element 130 on the substrate 110 is overlapped with the at least a portion of the orthographic projection of the recessed portion 216 on the substrate 110, as shown in FIG. 6A, when the light emitted from the light-emitting element 130 is irradiated to the recessed portion 216, part of the light is able to pass through a wall surface 2161 of the recessed portion 216 to be irradiated to the outside of the lens 210 (as shown by the light ray e in FIG. 6A), and another part of the light is able to be irradiated to the first recess 212 due to reflection effect of the wall surface 2161 of the recessed portion 216 (as shown by the light ray f or the light ray g in FIG. 6A).

It will be understood that the part of the light irradiated to the first recess 212 is able to pass through the first recess 212, and is scattered by the sub-structure(s) 142 embedded in the first recess 212 (as shown by the light ray g in FIG. 6A).

In this way, the light is able to be irradiated to at least one sub-structure 142 due to the reflection effect of the recessed portion 216, so that the intensity of light irradiated to the at least one sub-structure 142 is increased, so as to improve the scattering effect of the at least one sub-structure 142 on the light, thereby further weakening the bright and dark regions of the light-emitting module 200 to improve the brightness uniformity of the light-emitting module 200.

The another part of the light irradiated to the first recess 212 is able to be irradiated to the outside of the lens 210 due to reflection effect of a wall surface of the first recess 212 (as shown by the light ray f in FIG. 6A), thereby further improving the intensity of the light irradiated to the position between two adjacent light-emitting regions 102 to improve the brightness uniformity of the light-emitting substrate 100.

In some examples, the recessed portion 216 is in a shape of a cone. The orthographic projection of the light-emitting element 130 on the substrate 110 is within the orthographic projection of the recessed portion 216 on the substrate 110.

In some embodiments, the lens 210 further includes a filling portion 218, and the filling portion 218 is filled in the recessed portion 216, such that the surface of the lens 210 away from the substrate 110 is a smooth plane. It will be understood that the filling portion 218 is made of a transparent material. A refractive index of the filling portion 218 is different from a refractive index of the lens 210.

In some examples, the refractive index of the filling portion 218 is greater than the refractive index of the lens 210, so that the light irradiated to the wall surface 2161 of the recessed portion 216 (i.e., light irradiated to a contact surface of the recessed portion 216 and the filling portion 218) is easy to pass through the recessed portion 216 and the filling portion 218 to be irradiated to the outside of the lens 210, thereby improving the brightness of the light-emitting region 102.

In some other examples, the refractive index of the filling portion 218 is less than the refractive index of the lens 210, so that the light irradiated to the wall surface 2161 of the recessed portion 216 (i.e., the light irradiated to the contact surface of the recessed portion 216 and the filling portion 218) is able to be totally reflected by the wall surface 2161 of the recessed portion 216, thereby increasing the intensity of the light irradiated to the first recess 212. That is, the intensity of the light irradiated to the sub-structure 142 is increased, so as to improve the scattering effect of the diffusion particles 164 on the light, thereby further improving the brightness between two adjacent light-emitting elements 130 to improve the brightness uniformity of the light-emitting module 200.

In some embodiments, as shown in FIG. 6A, each of the at least one lens 210 is configured to further have second recess(s) 214 in the surface thereof proximate to the substrate 110. It can be seen from the above that the light-emitting element 130 includes the light-emitting portion 132. At least a portion of the light-emitting portion 132 is located in the second recess 214.

It will be understood that the second recess 214 is disposed in the direction from the substrate 110 to the lens 210 to function to gather light. The at least a portion of the light-emitting portion 132 is located in the second recess 214, so that the light emitted from the light-emitting portion 132 is able to be irradiated to an inner wall of the second recess 214, and is refracted and gathered on the inner wall of the second recess 214, so as to reduce the intensity of the light irradiated to other light-emitting region 102. Thus, the crosstalk between two adjacent light-emitting regions 102 is reduced, and the brightness of the light-emitting region 102 is able to be increased, thereby reducing the power consumption of the light-emitting module 200.

In addition, the at least a portion of the light-emitting portion 132 is arranged to be located in the second recess 214, so that there is no need to provide an additional space to accommodate the light-emitting portion 132, which facilitates the thinning of the light-emitting module 200, and the light-emitting portion 132 is able to be protected to improve the reliability of the light-emitting module 200.

In some examples, as shown in FIG. 6A, the light-emitting module 200 further includes light adjustment film(s) 219 located on a side of the lens(es) 210 away from the substrate 110. An orthographic projection of the light adjustment film 219 on the substrate 110 is at least partially overlapped with the orthographic projection of the recessed portion 216 on the substrate 110.

In some examples, the orthographic projection of the light adjustment film 219 on the substrate 110 covers the orthographic projection of the recessed portion 216 on the substrate 110.

In some examples, the light adjustment film 219 is attached to the surface of the lens 210 away from the substrate 110.

In some examples, there are a plurality of lenses 210, and there are also a plurality of light adjustment films 219, and a light adjustment film 219 is located on a side of a lens 210 away from the substrate 110.

It will be understood that the light adjustment film 219 has different light transmittances at different positions thereof, so that the light adjustment film 219 is able to adjust the light intensity to improve the brightness uniformity of the recessed portion 216, thereby further improving the brightness uniformity of each light-emitting region 102, i.e., improving the brightness uniformity of the light-emitting module 200.

Figure 6B:
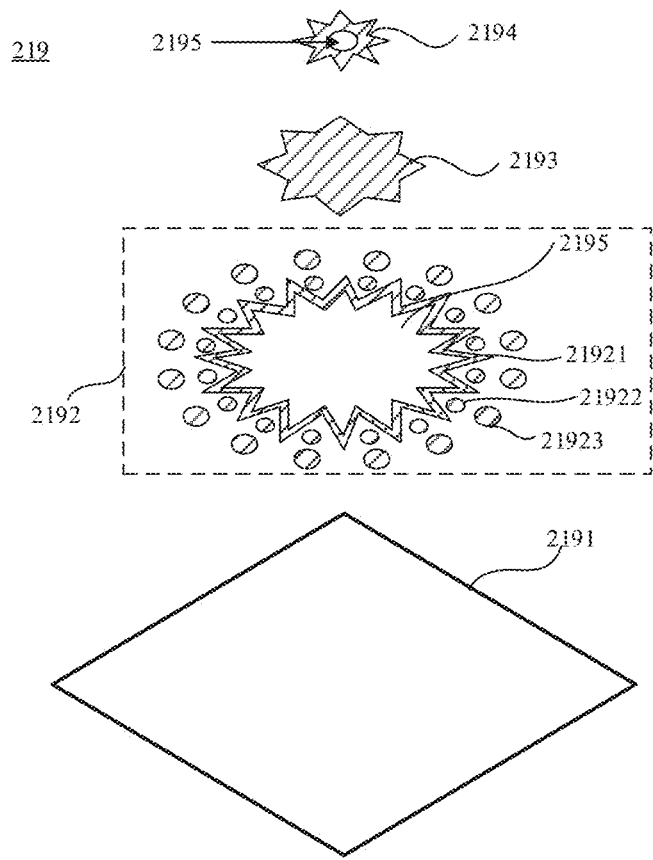
FIG. 6B is an exploded view of a light adjustment film, in accordance with some embodiments.

FIG. 6B is an exploded view of a light adjustment film, in accordance with some embodiments.

In some examples, as shown in FIG. 6B, the light adjustment film 219 includes a first light adjustment film 2191, a second light adjustment film 2192, a third light adjustment film 2193 and a fourth light adjustment film 2194.

For example, the first light adjustment film 2191 is a transparent film, and is attached to the surface of the lens 210 away from the substrate 110.

For example, the second light adjustment film 2192, the third light adjustment film 2193 and the fourth light adjustment film 2194 are stacked on a side of the first light adjustment film 2191 away from the lens 210 by printing or evaporation.

For example, light transmittances of the second light adjustment film 2192, the third light adjustment film 2193 and the fourth light adjustment film 2194 may be the same or different.

An orthographic projection of the second light adjustment film 2192 on the substrate 110 is within an orthographic projection of the first light adjustment film 2191 on the substrate 110. An orthographic projection of the third light adjustment film 2193 on the substrate 110 is within the orthographic projection of the second light adjustment film 2192 on the substrate 110. An orthographic projection of the fourth light adjustment film 2194 on the substrate 110 is within the orthographic projection of the third light adjustment film 2193 on the substrate 110.

For example, centers of the first light adjustment film 2191, the second light adjustment film 2192, the third light adjustment film 2193 and the fourth light adjustment film 2194 coincide with each other.

For example, as shown in FIG. 6B, the second light adjustment film 2192 and the fourth light adjustment film 2194 each have a light-transmitting hole 2195. It will be understood that since the first light adjustment film 2191, the second light adjustment film 2192, the third light adjustment film 2193 and the fourth light adjustment film 2194 are stacked, the light adjustment film 219 may have different light transmittances at different positions by adjusting positions and sizes of the light-transmitting holes 2195, so as to improve the brightness uniformity of the light-emitting region 102.

In some examples, the light-transmitting hole 2195 is in a shape of a circle. In some other examples, the light-transmitting hole 2195 may be in a shape of a regular polygon or a regular star polygon. The shape of the light-transmitting hole 2195 is not further limited in the embodiments of the present disclosure.

In some examples, as shown in FIG. 6B, the light-transmitting hole 2195 disposed in the fourth light adjustment film 2194 is located at the center of the fourth light adjustment film 2194.

In some examples, as shown in FIG. 6B, the first light adjustment film 2191 is in a shape of a rectangle. The third light adjustment film 2193 and the fourth light adjustment film 2194 each are in a shape of a regular star hexadecagon, and are similar to each other in shape. However, an area of the third light adjustment film 2193 is greater than an area of the fourth light adjustment film 2194. The second light adjustment film 2192 includes a loop-shaped structure 21921 consisting of two regular star triacontadigons in profile that are coaxially arranged (i.e., the light-transmitting hole 2195 of the second light adjustment film 2192 is in a shape of a regular star triacontadigon), and a plurality of discrete circular patterns 21922 and 21923 surrounding the loop-shaped structure 21921. In any two adjacent circular patterns in any direction away from the geometric center of the second light adjustment film 2192, an area of a circular pattern 21922 closer to the center of the second light adjustment film 2192 is less than an area of a circular pattern 21923 farther from the center of the second light adjustment film 2192.

That is, in any direction away from the center of the second light adjustment film 2192, areas of circular patterns disposed in the second light adjustment film 2192 are increased in sequence.

In some examples, as shown in FIG. 6B, the second light adjustment film 2192 includes a first sub-film and a second sub-film. The first sub-film is in a shape of a circle or an approximate circle, and the second sub-film is in a shape of a star octagon. The first sub-film is attached to a surface of the first light adjustment film 2191 away from the lens 210, and the second sub-film is attached to a surface of the first sub-film away from the first light adjustment film 2191. The light-transmitting hole 2195 disposed in the second light adjustment film 2192 penetrates the first sub-film, or penetrates the first sub-film and the second sub-film.

In some examples, the third light adjustment film 2193 may also be provided with a light-transmitting hole 2195, so that the light adjustment film 219 is able to meet different light transmittance requirements.

In some other examples, the first light adjustment film 2191, the second light adjustment film 2192, the third light adjustment film 2193 and the fourth light adjustment film 2194 may be in other regular or irregular shapes.

In some examples, a thickness of the first light adjustment film 2191 is in a range of 2.0 µm to 10 µm, inclusive. For example, the thickness of the first light adjustment film 2191 may be 3 µm, 5 µm, 7 µm, 8 µm, or 9 µm.

In some examples, a material of the first light adjustment film 2191 includes polyethylene terephthalate (PET).

In some examples, a thickness of the second light adjustment film 2192 is in a range of 2.0 µm to 10 µm, inclusive. For example, the thickness of the second light adjustment film 2192 may be 3 µm, 5 µm, 7 µm, 8 µm, or 9 µm.

In some examples, a thickness of the third light adjustment film 2193 is in a range of 2.0 µm to 10 µm, inclusive. For example, the thickness of the third light adjustment film 2193 may be 3 µm, 5 µm, 7 µm, 8 µm, or 9 µm.

In some examples, a thickness of the fourth light adjustment film 2194 is in a range of 2.0 µm to 10 µm, inclusive. For example, the thickness of the fourth light adjustment film 2194 may be 3 µm, 5 µm, 7 µm, 8 µm, or 9 µm.

It will be understood that the thicknesses of the first light adjustment film 2191, the second light adjustment film 2192, the third light adjustment film 2193 and the fourth light adjustment film 2194 may be the same or different.

For example, a material of the second light adjustment film 2192, a material of the third light adjustment film 2193 and a material of the fourth light adjustment film 2194 each include resin, which is obtained, for example, by die-cutting a polyurethane-based resin sheet (e.g., Victorian die-cutting processing). For example, other synthetic resins such as nylon may be used. A resin material with specific patterns may be directly formed on the lens 210 by printing or evaporation.

In some other examples, the light adjustment film 219 may not include the first light adjustment film 2191, but includes only the second light adjustment film 2192, the third light adjustment film 2193 and the fourth light adjustment film 2194. The second light adjustment film 2192, the third light adjustment film 2193 and the fourth light adjustment film 2194 are stacked on the surface of the lens 210 away from the substrate 110.

In some embodiments, the light-emitting element 130 is configured to emit white light.

It can be seen from the above that the light-emitting element 130 includes the light-emitting portion 132. In some examples, phosphor may be provided on a light exit surface of the light-emitting portion 132, so as to modulate monochromatic light emitted from the light-emitting portion 132 by the phosphor. The modulated light is mixed with the monochromatic light emitted from the light-emitting portion 132, so that the light-emitting element 130 is able to emit white light.

For example, in a case where the light-emitting portion 132 can emit blue light, yellow phosphor may be disposed on the light exit surface of the light-emitting portion 132. The yellow phosphor is able to emit yellow light under light irradiation, and the yellow light is mixed with the blue light emitted from the light-emitting portion 132, so that the light-emitting element 130 is able to emit white light.

For example, in the case where the light-emitting portion 132 can emit blue light, red phosphor and green phosphor may be disposed on the light exit surface of the light-emitting portion 132. The red phosphor is able to emit red light under light irradiation, the green phosphor is able to emit green light under light irradiation, and the red light and the green light are mixed to obtain yellow light. The yellow light is mixed with the blue light emitted from the light-emitting portion 132, so that the light-emitting element 130 is able to emit white light.

In some other examples, the light-emitting element 130 includes first sub-light-emitting element(s), second sub-light-emitting element(s) and third sub-light-emitting element(s). The first sub-light-emitting element is configured to emit red light, the second sub-light-emitting element is configured to emit green light, and the third sub-light-emitting element is configured to emit blue light. The red light, the green light and the blue light are mixed to enable the light-emitting element 130 to emit white light.

For example, the number of the first sub-light-emitting element(s), the number of the second sub-light-emitting element(s) and the number of the third sub-light-emitting element(s) may be the same or different.

It will be understood that the light-emitting element 130 is configured to emit white light, and light of different colors may be obtained by filtering the white light. That is, the light-emitting module 200 is able to emit light of different colors, thereby improving the applicability of the light-emitting module 200.

It can be seen from the above that in some embodiments, the light-emitting element 130 is configured to emit white light. In other embodiments, the light-emitting element 130 is configured to emit monochromatic light. For example, the monochromatic light is blue light.

Figure 6C:
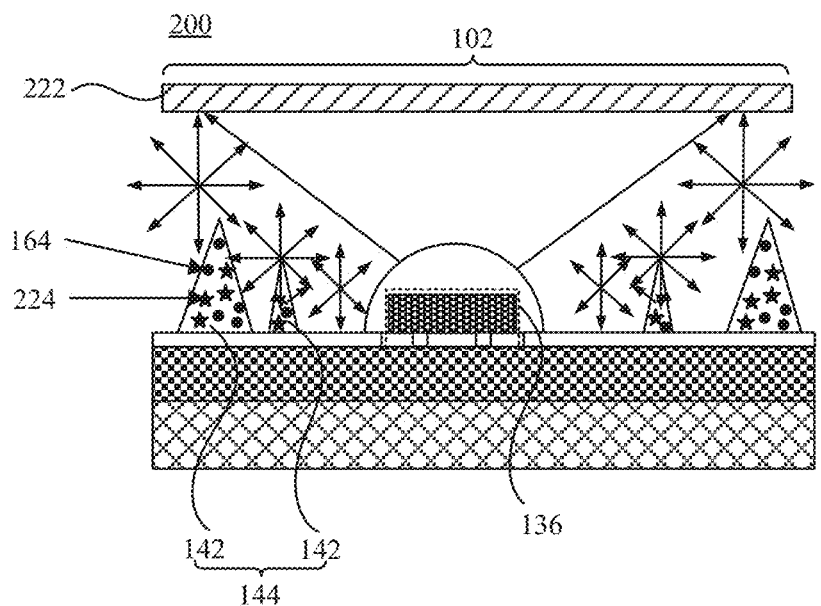
FIG. 6C is a structural diagram of a first light-emitting element and a first light adjustment portion, in accordance with some embodiments.

FIG. 6C is a structural diagram of a first light-emitting element and a first light adjustment portion, in accordance with some embodiments.

It can be seen from the above that, as shown in FIG. 6C, the light-emitting module 200 further includes the color conversion film 222. The color conversion film 222 is located on a side of the at least one lens 210 away from the light-emitting element 130.

It will be understood that the color conversion film 222 is located on the side of the at least one lens 210 away from the light-emitting element 130, so that the monochromatic light emitted from the light-emitting element 130 is able to be irradiated to the color conversion film 222, and is converted into red light, green light and blue light by the color conversion film 222. It will be understood that the red light, the green light and the blue light with different intensities are mixed to obtain colored light, so that the light-emitting module 200 is able to display color image(s).

It can be seen from the above that the color conversion film 222 is the quantum dot film 2221. In some embodiments, as shown in FIG. 5G, the light-emitting elements 130 include first light-emitting elements 136. An orthographic projection of the first light-emitting element 136 on the substrate 110 is proximate to an edge of an orthographic projection of the quantum dot film 2221 on the substrate 110. The light adjustment portions 140 include first light adjustment portions 144 each surrounding a first light-emitting element 136.

It will be understood that in the embodiments of the present disclosure, the first light-emitting element 136 is only used for describing a light-emitting element 130 whose orthographic projection on the substrate 110 is proximate to the edge of the orthographic projection of the quantum dot film 2221 on the substrate 110, and the light-emitting element 130 is not further limited. The first light adjustment portion 144 is only used for describing a light adjustment portion 140 surrounding the first light-emitting element 136, and the light adjustment portion 140 is not further limited.

Figure 6D:
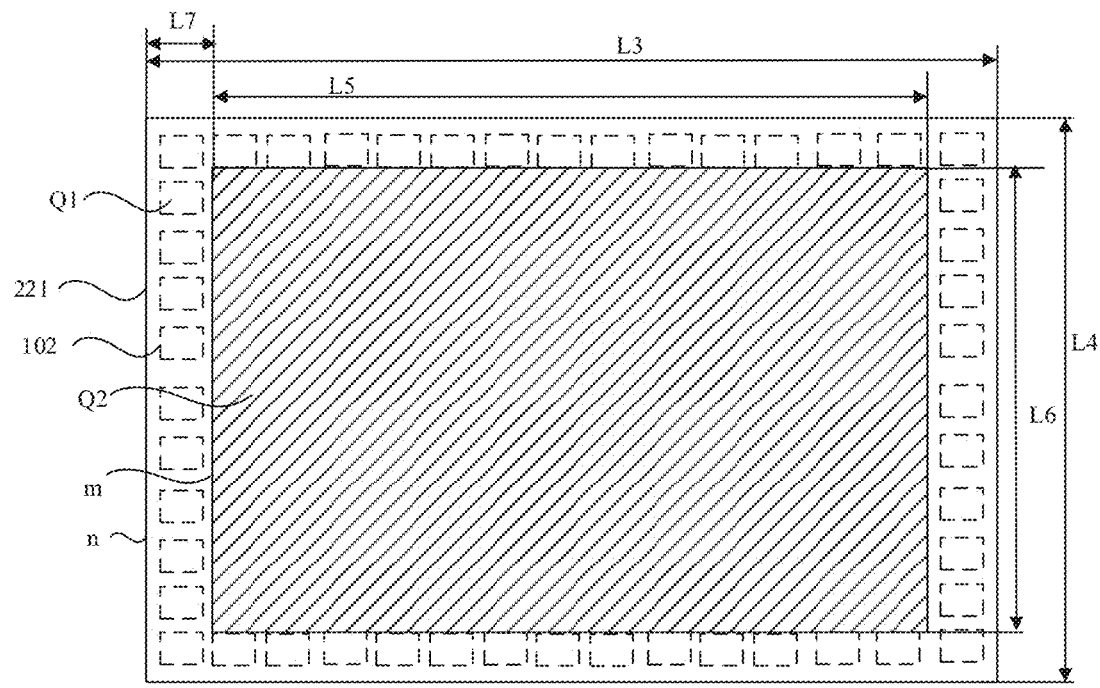
FIG. 6D is a structural diagram of an edge region of a quantum dot film, in accordance with some embodiments.
Figure 6E:
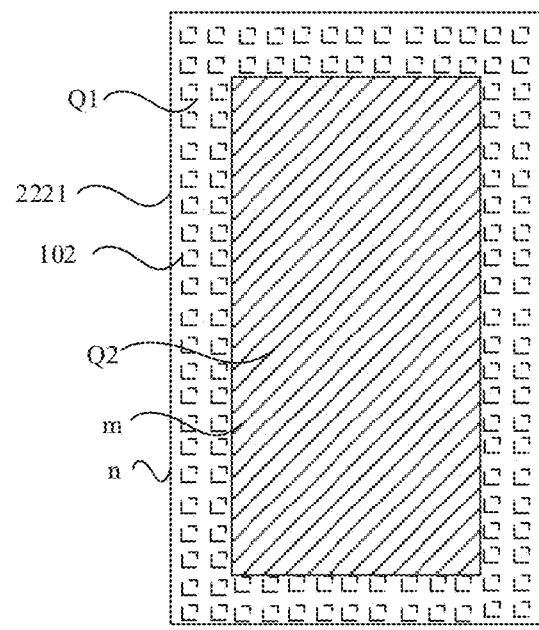
FIG. 6E is a structural diagram of an edge region of a quantum dot film, in accordance with some other embodiments.
Figure 6F:
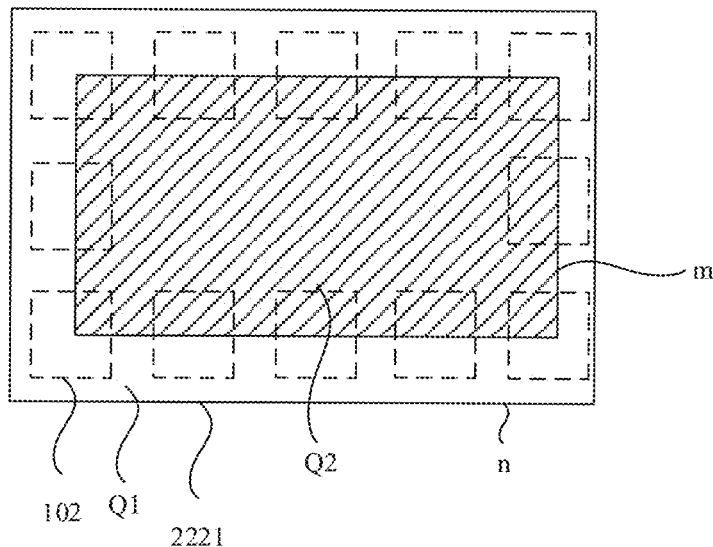
FIG. 6F is a structural diagram of an edge region of a quantum dot film, in accordance with yet other embodiments.

FIG. 6D is a structural diagram of an edge region of a quantum dot film, in accordance with some embodiments. FIG. 6E is a structural diagram of an edge region of a quantum dot film, in accordance with some other embodiments. FIG. 6F is a structural diagram of an edge region of a quantum dot film, in accordance with yet other embodiments.

In some examples, as shown in FIG. 6D, the orthographic projection of the quantum dot film 2221 on the substrate 110 has an edge region Q1 and a center region Q2, and the edge region Q1 surrounds the center region Q2. There are boundary lines m between the edge region Q1 and the center region Q2, and the orthographic projection of the quantum dot film 2221 on the substrate 110 has edges n.

It will be understood that the orthographic projection of the first light-emitting element 136 on the substrate 110 is proximate to the edge of the orthographic projection of the quantum dot film 2221 on the substrate 110. That is, the orthographic projection of the first light-emitting element 136 on the substrate 110 is in the edge region Q1 of the orthographic projection of the quantum dot film 2221 on the substrate 110.

It will be understood that an edge of the quantum dot film 2221 is prone to failure due to oxidation and other reasons, so that at the edge, the blue light emitted from the light-emitting element 130 cannot be converted into red light and green light, and thus blue light leakage phenomenon may occur at an edge of the light-emitting module 200, which affects the light-emitting performance of the light-emitting module 200.

In order to reduce the blue light leakage at the edge of the light-emitting module 200, as shown in FIG. 6C, the light-emitting module 200 further includes phosphor particles 224. The phosphor particles 224 are located in at least one sub-structure 142 in the first light adjustment portion 144. The phosphor particles 224 are configured to modulate light irradiated to the phosphor particles 224, so that the modulated light is mixed with an unmodulated light emitted from the light-emitting element 130 to form white light.

It will be understood that the phosphor particles 224 are configured to modulate the light irradiated to the phosphor particles 224. That is, the phosphor particles 224 are able to emit light under light irradiation. Since the orthographic projection of the first light-emitting element 136 on the substrate 110 is proximate to the edge of the orthographic projection of the quantum dot film 2221 on the substrate 110 (that is, the orthographic projection of the first light-emitting element 136 on the substrate 110 is in the edge region Q1 of the orthographic projection of the quantum dot film 2221 on the substrate 110), the phosphor particles 224 are disposed in the at least one sub-structure 142 in the first light adjustment portion 144, so that the phosphor particles 224 are able to modulate the monochromatic light emitted from the light-emitting element 130. The modulated light is mixed with the monochromatic light emitted from the light-emitting element 130 to form white light, thereby reducing the blue light leakage at the edge of the light-emitting module 200 to improve the light-emitting performance of the light-emitting module 200.

In some examples, a distance (as indicated by L7 in FIG. 6D) between a boundary line m between the edge region Q1 and the center region Q2 and a corresponding edge n of the orthographic projection of the quantum dot film 2221 on the substrate 110 is less than or equal to 2 mm.

For example, as shown in FIG. 6D, the quantum dot film 2221 has a width of L3 and a length of L4. The center region Q2 of the orthographic projection of the quantum dot film 2221 on the substrate 110 has a width L5 of less than L3 and a length L6 of less than L4. Moreover, a geometric center of the center region Q2 is almost coaxial with a geometric center of the quantum dot film 2221, so that the distance (as indicated by L7 in FIG. 6D) between the boundary line m and the corresponding edge n in a direction perpendicular to an extending direction of the corresponding edge is approximately the same, e.g., is about 2 mm.

In some examples, the plurality of sub-structures 142 in the first light adjustment portion 144 are each provided with phosphor particles 224.

For example, in each of the plurality of sub-structures 142, a mass ratio of the phosphor particles 224 (i.e., a ratio of a weight of the phosphor particles 224 in a sub-structure 142 to a weight of this sub-structure 142) may be the same or different.

In some examples, the mass ratio of the phosphor particles 224 is 5%.

It can be seen from the above that in some examples, the light transmittance of the sub-structure 142 is in the range of 50% to 100%, inclusive.

In some examples, in a case where the phosphor particles 224 are disposed in the sub-structure 142, the light transmittance of the sub-structure 142 is in a range of 80% to 100%, inclusive. In this way, the intensity of the light irradiated to the sub-structure 142 is able to be increased to increase an intensity of the light irradiated to the phosphor particles 224, so that the modulation effect of the phosphor particles 224 on the light emitted from the light-emitting element 130 is improved, thereby further reducing the blue light leakage at the edge of the light-emitting module 200 to improve the light-emitting performance of the light-emitting module 200.

It can be seen from the above that in some examples, in any two sub-structures 142 in the light adjustment portion 140 in any direction away from the light-emitting element 130, the height of the sub-structure 142 closer to the light-emitting element 130 is less than the height of the sub-structure 142 farther from the light-emitting element 130. Moreover, in any two sub-structures 142 in the light adjustment portion 140 in any direction away from the light-emitting element 130, the area of the orthographic projection, on the substrate 110, of the sub-structure 142 closer to the light-emitting element 130 is less than the area of the orthographic projection, on the substrate 110, of the sub-structure 142 farther from the light-emitting element 130.

That is, in any direction away from the light-emitting element 130, the heights of the sub-structures 142 in the light adjustment portion 140 may be gradually increased, and the areas of the orthographic projections of the sub-structures 142 in the light adjustment portion 140 on the substrate 110 may also be gradually increased.

In some examples, in any direction away from the light-emitting element 130, heights of sub-structures 142 in the first light adjustment portion 144 may be gradually increased, or may be the same or approximately the same.

In some examples, in any direction away from the light-emitting element 130, areas of orthographic projections of sub-structures 142 in the first light adjustment portion 144 on the substrate 110 may be gradually increased, or may be the same or approximately the same.

In some examples, in any direction away from the first light-emitting element 136, the areas of the orthographic projections of the sub-structures 142 in the first light adjustment portion 144 on the substrate 110 are the same, and the heights of the sub-structures 142 in the first light adjustment portion 144 are gradually increased. Moreover, the mass ratio of the phosphor particles 224 in each of the plurality of sub-structures 142 is the same. In this way, there is no need to adjust the mass ratio of the phosphor particles 224 in a different sub-structure 142, which simplifies the manufacturing process.

In some other examples, in any direction away from the first light-emitting element 136, the areas of the orthographic projections of the sub-structures 142 in the first light adjustment portion 144 on the substrate 110 are gradually increased, and the heights of the sub-structures 142 in the first light adjustment portion 144 are the same. Moreover, the mass ratio of the phosphor particles 224 in each of the plurality of sub-structures 142 is the same. In this way, there is also no need to adjust the mass ratio of the phosphor particles 224 in a different sub-structure 142, which simplifies the manufacturing process.

In yet other examples, in any direction away from the first light-emitting element 136, the areas of the orthographic projections of the sub-structures 142 in the first light adjustment portion 144 on the substrate 110 are the same, and the heights of the sub-structures 142 in the first light adjustment portion 144 are gradually increased. Moreover, the mass ratio of the phosphor particles 224 in each sub-structure 142 is different.

For example, in the sub-structures 142 in any direction away from the first light-emitting element 136, the mass ratios of the phosphor particles 224 may be set to be gradually increased, thereby further reducing the blue light leakage at the edge of the light-emitting module 200 to improve the light-emitting performance of the light-emitting module 200.

In some examples, the mass ratio of the phosphor particles 224 is in a range of 5% to 12%, inclusive. For example, the mass ratio of the phosphor particles 224 may be in a range of 6% to 10%, 7% to 9%, or 7.5% to 8.5%. For example, the mass ratio of the phosphor particles 224 may be 5.5%, 6.5%, or 7.5%.

In some examples, as shown in FIGS. 6D and 6E, if the plurality of light-emitting elements are arranged at intervals less than a size of the edge region Q1 (i.e., the distance L7), at least one light-emitting region 102, whose orthographic projection(s) on the substrate 110 are entirely within the edge region Q1 of the orthographic projection of the quantum dot film 2221 on the substrate 110, exists. That is, the orthographic projection, on the substrate 110, of the light-emitting assembly 120 (including the first light-emitting element(s) 136 and the first light adjustment portion 144) located in the light-emitting region 102 is entirely in the edge region Q1 of the orthographic projection of the quantum dot film 2221 on the substrate 110.

For example, as shown in FIG. 6D, light-emitting regions 102 whose orthographic projections on the substrate 110 are in the edge region Q1 are arranged in a loop. For example, the light-emitting regions 102 whose orthographic projections on the substrate 110 are in the edge region Q1 may be arranged in a circular loop, an elliptical loop, a rectangular loop, a polygonal loop, or other irregular loop.

For example, as shown in FIG. 6E, the light-emitting regions 102 whose orthographic projections on the substrate 110 are in the edge region Q1 are arranged in at least two concentric loops. For example, the light-emitting regions 102 whose orthographic projections on the substrate 110 are in the edge region Q1 may be arranged in at least two concentric circular loops, at least two concentric elliptical loops, at least two concentric rectangular loops, at least two concentric polygonal loops, or at least two other concentric irregular loops.

In some other examples, if the plurality of light-emitting elements are arranged at intervals of 20 mm to 50 mm (that is, a plurality of first light-emitting elements 136 are also arranged at intervals of 20 mm to 50 mm), only a portion of an orthographic projection of each first light-emitting element 136 on the substrate 110 is in the edge region Q1. In the first light adjustment portion 144 surrounding the first light-emitting element 136, orthographic projections of a part of (two or more) sub-structures 142 (referred to as first sub-structures) on the substrate 110 are in the edge region Q1, and orthographic projections of another part of (two or more) sub-structures 142 (referred to as second sub-structures) on the substrate 110 are in the center region Q2. As shown in FIG. 6F, the orthographic projection of the light-emitting region 102 on the substrate 110 has a portion in the edge region Q1 and another portion in the center region Q2.

In this way, the phosphor particles 224 may be disposed in at least one first sub-structure (i.e., the sub-structure(s) 142 whose orthographic projection(s) on the substrate 110 are in the edge area Q1), and are not disposed in the second sub-structure (i.e., the sub-structure 142 whose orthographic projection on the substrate 110 is in the center region Q2), so that the using amount of the phosphor particles 224 is saved, and the manufacturing process is simplified, thereby reducing the cost of the light-emitting module 200.

In some embodiments, the light-emitting element 130 is configured to emit blue light, and the phosphor particles 224 include yellow phosphor particles. Alternatively, the light-emitting element 130 is configured to emit blue light, and the phosphor particles 224 include red phosphor particles and green phosphor particles.

It will be understood that blue light and yellow light are able to be mixed into white light, and red light and green light are able to be mixed into yellow light. Therefore, in some examples, the phosphor particles 224 are arranged to include the yellow phosphor particles, i.e., the phosphor particles 224 are able to emit yellow light under light irradiation. The yellow light emitted from the phosphor particles 224 is mixed with the blue light emitted from the light-emitting element 130 to form white light.

In some other examples, the phosphor particles 224 are arranged to include the red phosphor particles and the green phosphor particles, i.e., the phosphor particles 224 are able to emit red light and green light under light irradiation. The red light and the green light are able to be mixed into yellow light, and the yellow light is mixed with the blue light emitted from the light-emitting element 130 to form white light.

Figure 6G:
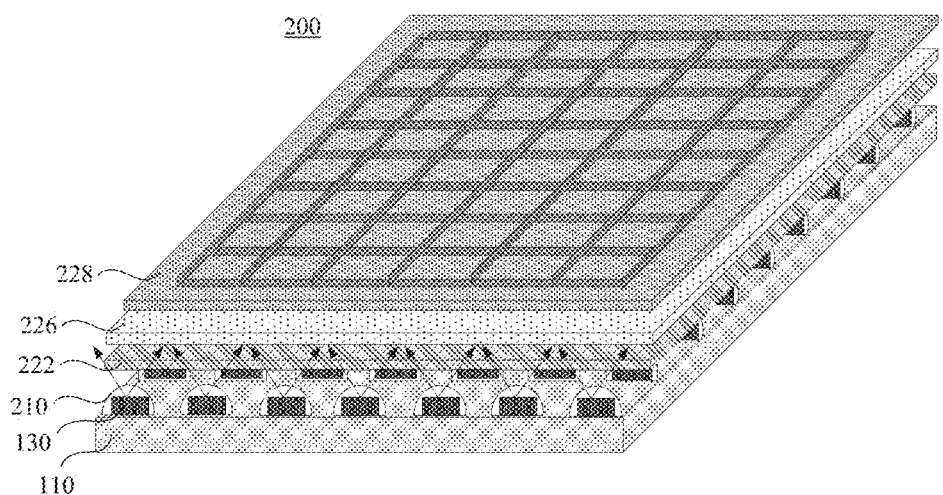
FIG. 6G is a structural diagram of a light-emitting module, in accordance with yet other embodiments.
Figure 6H:
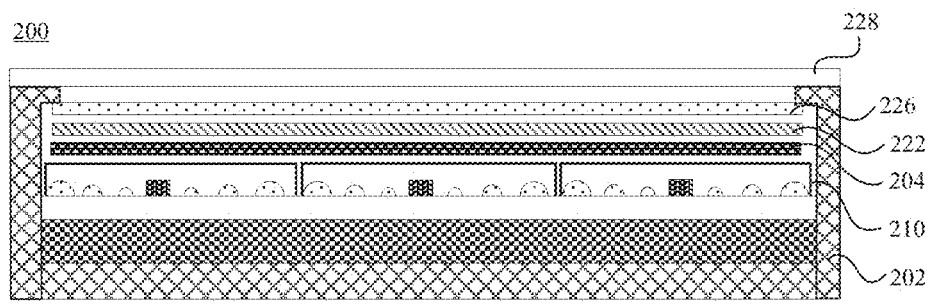
FIG. 6H is a structural diagram of a light-emitting module, in accordance with yet other embodiments.

FIG. 6G is a structural diagram of a light-emitting module, in accordance with yet other embodiments. FIG. 6H is a structural diagram of a light-emitting module, in accordance with yet other embodiments.

In some embodiments, as shown in FIG. 6G, the light-emitting module 200 further includes a brightness enhancement film 226. The brightness enhancement film 226 is located on a side of the color conversion film 222 away from the at least one lens 210.

It will be understood that the brightness enhancement film 226 functions to increase the brightness of the display region 104, so as to reduce the power consumption of the light-emitting module 200. In some examples, the brightness enhancement film 226 includes a prism. When light is irradiated to the prism, the light is able to be reflected or refracted due to an action of the prism, thereby increasing the brightness of the light-emitting module 200.

In some other examples, the brightness enhancement film 226 includes a casting polypropylene (CPP) film.

In some examples, as shown in FIG. 6G, the light-emitting module 200 further includes an encapsulation panel 228. The encapsulation panel 228 is located on a side of the brightness enhancement film 226 away from the color conversion film 222. It will be understood that the encapsulation panel 228 has protection and encapsulation functions.

It will be understood that the encapsulation panel 228 is made of a transparent material, so that light is able to be irradiated to the outside of the light-emitting module 200 through the encapsulation panel 228. For example, the material of the encapsulation panel 228 includes glass.

In some examples, as shown in FIG. 6H, the light-emitting module 200 further includes a plastic frame 202 for supporting the encapsulation panel 228.

In some examples, the light-emitting module 200 further includes a diffusion film. The diffusion film is located between the brightness enhancement film 226 and the encapsulation panel 228, and has a light uniformizing function, thereby further improving the brightness uniformity of the light-emitting module 200.

In some examples, as shown in FIG. 6H, the light-emitting module 200 further includes a light uniformizing film 204. The light homogenizing film 204 is located between the lens 210 and the color conversion film 222, and has a light uniformizing function, thereby further improving the brightness uniformity of the light-emitting module 200.

Figure 7A:
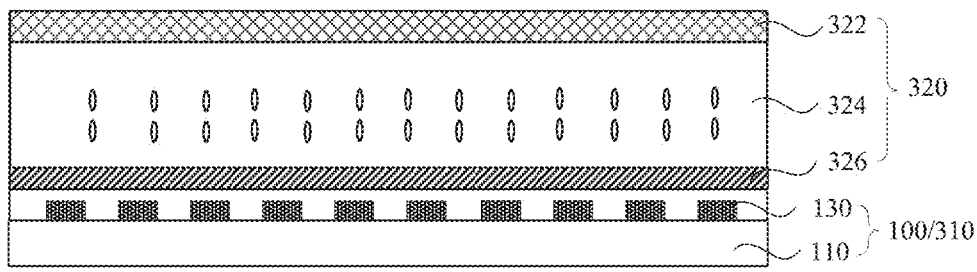
FIG. 7A is a structural diagram of a display device, in accordance with some embodiments.
Figure 7B:
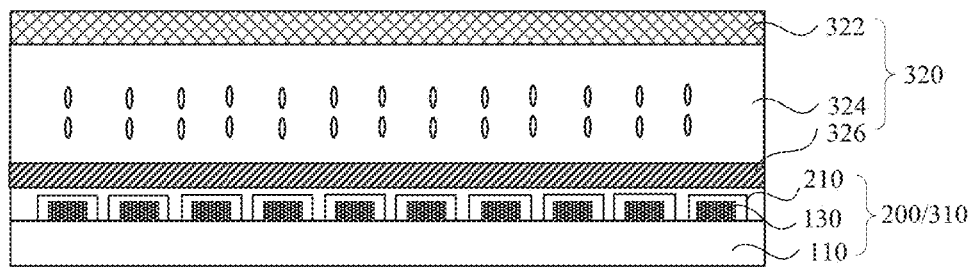
FIG. 7B is a structural diagram of a display device, in accordance with some other embodiments.

FIG. 7A is a structural diagram of a display device, in accordance with some embodiments. FIG. 7B is a structural diagram of a display device, in accordance with some other embodiments.

In another aspect, as shown in FIGS. 7A and 7B, a display device 300 is provided. The display device 300 includes a backlight module 310 and a liquid crystal display panel 320. The liquid crystal display panel 320 is located on a light exit side of the backlight module 310. As shown in FIG. 7A, the backlight module 310 includes the above light-emitting substrate 100. Alternatively, as shown in FIG. 7B, the backlight module 310 includes the above light-emitting module 200.

The display device 300 provided in the embodiments of the present disclosure includes the above light-emitting substrate 100, or includes the above light-emitting module 200, and therefore has all of the above beneficial effects, which will not be repeated here.

It will be understood that the display device 300 may display dynamic image information such as video(s) or game screen(s), or may display static image information such as image(s) or photograph(s).

In some embodiments, the display device 300 may be a mobile phone, a wireless device, a personal digital assistant (PDA), a handheld or portable computer, a GPS receiver/navigator, a camera, an MP4 video player, a video camera, a game console, a watch, a clock, a calculator, a television monitor, a flat panel display, a computer monitor, an automotive display (e.g., an odometer display), a navigator, a cockpit controller and/or display, a camera view display (e.g., a rear-view camera display in a vehicle), an electronic photo, an electronic billboard or sign, a projector, a packaging, or an aesthetic structure (e.g., a display for an image of a piece of jewelry).

For example, the liquid crystal display panel 320 is located on the light exit side of the backlight module 310.

That is, light emitted from the backlight module 310 is able to be irradiated to the liquid crystal display panel 320. The liquid crystal display panel 320 will be exemplarily described below.

For example, as shown in FIGS. 7A and 7B, the liquid crystal display panel 320 includes an array substrate 326, a liquid crystal layer 324 and an opposite substrate 322. The array substrate 326 is located on the light exit side of the backlight module 310, and the liquid crystal layer 324 is located on a side of the array substrate 326 away from the backlight module 310. The opposite substrate 322 is located on a side of the liquid crystal layer 324 away from the array substrate 326.

It will be understood that as shown in FIG. 7B, in an example where the backlight module 310 includes the above light-emitting module 200, light exits from the light exit side of the light-emitting module 200, and is irradiated to the liquid crystal layer 324. By adjusting an arrangement of liquid crystal molecules in the liquid crystal layer 324, an intensity of light transmitted through the liquid crystal layer 324 is able to be adjusted, thereby adjusting an intensity of light that exits from the liquid crystal display panel 320, so that the display device 300 realizes the function of displaying color images.

Figure 7C:
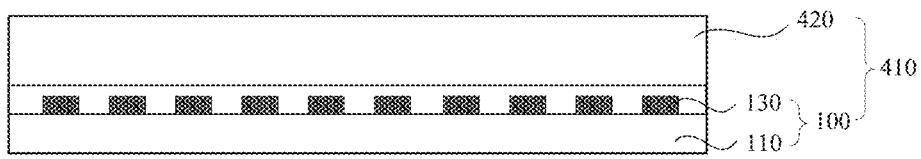
FIG. 7C is a structural diagram of a display device, in accordance with yet other embodiments.
Figure 7D:
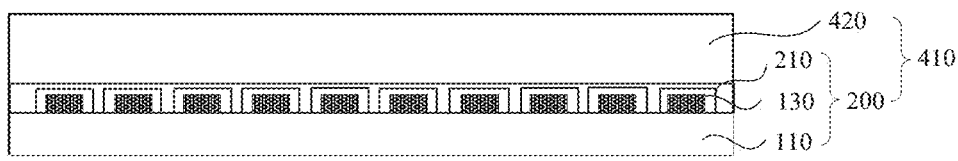
FIG. 7D is a structural diagram of a display device, in accordance with yet other embodiments.

FIG. 7C is a structural diagram of a display device, in accordance with yet other embodiments. FIG. 7D is a structural diagram of a display device, in accordance with yet other embodiments.

In yet another aspect, as shown in FIGS. 7C and 7D, embodiments of the present disclosure provide a display device 400. The display device 400 includes a display panel 410. The display panel 410 includes the above light-emitting substrate 100. Alternatively, the display panel 410 includes the above light-emitting module 200.

The display device 400 provided in the embodiments of the present disclosure includes the above light-emitting substrate 100 or the above light-emitting module 200, and therefore has all of the above beneficial effects, which will not be repeated here.

It will be understood that the display device 400 may display dynamic image information such as video(s) or game screen(s), or may display static image information such as image(s) or photograph(s).

In some embodiments, the display device 400 may be a mobile phone, a wireless device, a personal digital assistant (PDA), a handheld or portable computer, a GPS receiver/navigator, a camera, an MP4 video player, a video camera, a game console, a watch, a clock, a calculator, a television monitor, a flat panel display, a computer monitor, an automotive display (e.g., an odometer display), a navigator, a cockpit controller and/or display, a camera view display (e.g., a rear-view camera display in a vehicle), an electronic photo, an electronic billboard or sign, a projector, a packaging, or an aesthetic structure (e.g., a display for an image of a piece of jewelry).

In some examples, as shown in FIGS. 7C and 7D, the display panel 410 further includes a protective cover plate 420. The protective cover plate 420 is located on a side of the light-emitting elements 130 away from the substrate 110. It will be understood that the protective cover plate 410 functions to protect the light-emitting substrate 100 (or the light-emitting module 200).

In some embodiments, the substrate 110 may be arranged as a flexible substrate, so that the light-emitting substrate 100 or the light-emitting module 200 is bendable, and thus the display device 400 can realize curved surface display.

For example, an edge of the display device 400 is curved, so as to improve the display effect of the display device 400.

The foregoing descriptions are merely some specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A light-emitting substrate, comprising:
    a substrate;
    a plurality of light-emitting assemblies located on a side of the substrate; wherein at least one light-emitting assembly includes a light-emitting element and a light adjustment portion arranged around the light-emitting element; the light adjustment portion includes a plurality of sub-structures spaced apart from each other;
    a driving circuit layer located on the side of the substrate; wherein the driving circuit layer includes a metal wiring and a conductive pad, and the conductive pad is electrically connected to the metal wiring; and
    a reflective component located on a side of the driving circuit layer away from the substrate;
    wherein the reflective component encloses a reflective cavity, and has a communication hole;
    wherein in any two sub-structures in the light adjustment portion in any direction away from the light-emitting element, a height of a sub-structure closer to the light-emitting element is less than a height of a sub-structure farther from the light-emitting element;
    the light-emitting element includes a light-emitting portion and a pin; the light-emitting portion is located in the reflective cavity, and the pin is electrically connected to the conductive pad through the communication hole; the plurality of sub-structures in the light adjustment portion are located in the reflective cavity; and
    the reflective component includes:
        a bottom wall with the communication hole, wherein the plurality of sub-structures in the light adjustment portion are located on the bottom wall, and the plurality of sub-structures in the light adjustment portion are attached to the bottom wall; and
        side walls each having an end connected to the bottom wall and another end extending from the bottom wall in a direction away from the substrate; wherein the side walls and the bottom wall enclose the reflective cavity.

2. The light-emitting substrate according to claim 1, wherein in any two sub-structures in the light adjustment portion in any direction away from the light-emitting element, an area of an orthographic projection, on the substrate, of a sub-structure closer to the light-emitting element is less than an area of an orthographic projection, on the substrate, of a sub-structure farther from the light-emitting element.

3. The light-emitting substrate according to claim 1, further comprising:
    a reflective film located on a side of the driving circuit layer away from the substrate and exposing the conductive pad, and the reflective film is located between the driving circuit layer and the reflective component;
    wherein the light-emitting portion is located on a side of the reflective film away from the driving circuit layer, and the pin is electrically connected to the conductive pad; the plurality of sub-structures in the light adjustment portion are located on a side of the reflective film away from the driving circuit layer.

4. The light-emitting substrate according to claim 1, wherein the side walls and the bottom wall enclose the reflective cavity; and a side wall is perpendicular to the bottom wall.

5. The light-emitting substrate according to claim 4, wherein an orthographic projection of an edge of a side wall away from the bottom wall on a reference plane parallel to the side wall is in a shape of a plurality of curves that are continuous or a plurality of broken lines that are continuous.

6. The light-emitting substrate according to claim 1, wherein in any direction away from the light-emitting element, at least two sub-structures in the light adjustment portion are located on a straight line; and/or
   at least one sub-structure is in a shape of one of a cone, a pyramid, a truncated cone, a truncated pyramid and a hemisphere.

7. The light-emitting substrate according to claim 1, wherein in any direction away from the light-emitting element, an absolute value of a height difference between any two adjacent sub-structures in the light adjustment portion is in a range of 200 μm to 300 μm, inclusive; or
   in any direction away from the light-emitting element, an absolute value of a height difference between any two adjacent sub-structures in the light adjustment portion is equal to an absolute value of a height difference between any other two adjacent sub-structures in the light adjustment portion.

8. The light-emitting substrate according to claim 1, further comprising:
   diffusion particles located in at least one sub-structure; and/or
   the light-emitting substrate having a display region; wherein the at least one light-emitting assembly includes at least two light-emitting assemblies; a brightness of a light-emitting element proximate to an edge of the display region is greater than a brightness of a light-emitting element located at another position of the display region.

9. A light-emitting module, comprising:
   the light-emitting substrate according to claim 1; and
   at least one lens located on a side of the plurality of light-emitting assemblies away from the substrate.

10. The light-emitting module according to claim 9, wherein a lens in the at least one lens has at least one first recess in a surface thereof proximate to the substrate;
   and at least a portion of each of at least one sub-structure in the light adjustment portion is embedded in a first recess in the at least one first recess; or
   the lens in the at least one lens has the at least one first recess in the surface thereof proximate to the substrate; the at least a portion of each of the at least one sub-structure in the light adjustment portion is embedded in the first recess in the at least one first recess; the at least one first recess is a loop-shaped recess; and an orthographic projection of the loop-shaped recess on the substrate surrounds an orthographic projection of the light-emitting element on the substrate.

11. The light-emitting module according to claim 10, wherein the at least one first recess includes a plurality of first recesses; wherein
   heights of sub-structures embedded in a same first recess are equal; and/or
   areas of orthographic projections, on the substrate, of the sub-structures embedded in the same first recess are equal; and/or
   in any two first recesses in any direction away from the light-emitting element, a depth of a first recess closer to the light-emitting element is less than a depth of a first recess farther from the light-emitting element; and/or
   in any two first recesses in any direction away from the light-emitting element, a width of a first recess closer to the light-emitting element is less than a width of a first recess farther from the light-emitting element.

12. The light-emitting module according to claim 9, wherein a lens in the at least one lens has a recessed portion in a surface thereof away from the substrate; an orthographic projection of the light-emitting element on the substrate is partially overlapped with an orthographic projection of the recessed portion on the substrate; and/or
   a lens in the at least one lens has a second recess in a surface thereof proximate to the substrate; the light-emitting element includes a light-emitting portion, and at least a portion of the light-emitting portion is located in the second recess; and/or
   the light-emitting element is configured to emit white light.

13. The light-emitting module according to claim 9, wherein the light-emitting element is configured to emit monochromatic light; the light-emitting module further comprises:
   a color conversion film located on a side of the at least one lens away from the light-emitting element.

14. The light-emitting module according to claim 13, wherein the color conversion film is a quantum dot film; a light-emitting element in a light-emitting assembly is a first light-emitting element, and an orthographic projection of the first light-emitting element on the substrate is proximate to an edge of an orthographic projection of the quantum dot film on the substrate; a light adjustment portion in a light-emitting assembly is a first light adjustment portion, and the first light adjustment portion surrounds the first light-emitting element; the light-emitting module further comprises phosphor particles located in at least one sub-structure in the first light adjustment portion; the phosphor particles are configured to modulate light that is irradiated to the phosphor particles, so that the modulated light and unmodulated light emitted from the first light-emitting element are mixed into white light; or
   the color conversion film is the quantum dot film; the light-emitting element in the light-emitting assembly is the first light-emitting element, and the orthographic projection of the first light-emitting element on the substrate is proximate to the edge of the orthographic projection of the quantum dot film on the substrate; the light adjustment portion in the light-emitting assembly is the first light adjustment portion, and the first light adjustment portion surrounds the first light-emitting element; the light-emitting module further comprises the phosphor particles located in the at least one sub-structure in the first light adjustment portion; the phosphor particles are configured to modulate light that is irradiated to the phosphor particles, so that the modulated light and the unmodulated light emitted from the first light-emitting element are mixed into white light; wherein
   the first light-emitting element is configured to emit blue light, and the phosphor particles include yellow phosphor particles; or the first light-emitting element is configured to emit blue light, and the phosphor particles include red phosphor particles and green phosphor particles.

15. The light-emitting module according to claim 13, further comprising:
a brightness enhancement film located on a side of the color conversion film away from the at least one lens.

16. A display device, comprising:
a backlight module; and
a liquid crystal display panel located on a light exit side of the backlight module;
wherein the backlight module includes the light-emitting substrate according to claim 1.

17. A display device, comprising a display panel; wherein the display panel includes the light-emitting substrate according to claim 1.

18. A display device, comprising:
a backlight module; and
a liquid crystal display panel located on a light exit side of the backlight module;
wherein the backlight module includes the light-emitting module according to claim 9.

19. A display device, comprising a display panel; wherein the display panel includes the light-emitting module according to claim 9.

20. A light-emitting substrate, comprising:
a substrate;
a plurality of light-emitting assemblies located on a side of the substrate; wherein at least one light-emitting assembly includes a light-emitting element and a light adjustment portion arranged around the light-emitting element; the light adjustment portion includes a plurality of sub-structures spaced apart from each other;
a driving circuit layer located on the side of the substrate; wherein the driving circuit layer includes a metal wiring and a conductive pad, and the conductive pad is electrically connected to the metal wiring; and
a reflective film located on a side of the driving circuit layer away from the substrate and exposing the conductive pad;
wherein in any two sub-structures in the light adjustment portion in any direction away from the light-emitting element, a height of a sub-structure closer to the light-emitting element is less than a height of a sub-structure farther from the light-emitting element; and
the light-emitting element includes a light-emitting portion and a pin; the light-emitting portion is located on a side of the reflective film away from the driving circuit layer, and the pin is electrically connected to the conductive pad; the plurality of sub-structures in the light adjustment portion are located on a surface of the reflective film away from the driving circuit layer, and the plurality of sub-structures in the light adjustment portion are attached to the surface of the reflective film away from the driving circuit layer.

* * * * *